United States Patent
Choi et al.

(10) Patent No.: US 12,362,302 B2
(45) Date of Patent: Jul. 15, 2025

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Moorym Choi, Yongin-si (KR); Jungtae Sung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 577 days.

(21) Appl. No.: 17/713,478

(22) Filed: Apr. 5, 2022

(65) Prior Publication Data
US 2022/0359442 A1 Nov. 10, 2022

(30) Foreign Application Priority Data
May 10, 2021 (KR) .................. 10-2021-0060059

(51) Int. Cl.
| | |
|---|---|
| *H01L 25/18* | (2023.01) |
| *H01L 23/00* | (2006.01) |
| *H01L 25/00* | (2006.01) |
| *H01L 25/065* | (2023.01) |
| *H10B 41/27* | (2023.01) |
| *H10B 43/27* | (2023.01) |

(52) U.S. Cl.
CPC .............. *H01L 24/08* (2013.01); *H01L 24/80* (2013.01); *H01L 25/0657* (2013.01); *H01L 25/18* (2013.01); *H01L 25/50* (2013.01); *H10B 41/27* (2023.02); *H10B 43/27* (2023.02); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC .................... H01L 24/08; H01L 25/18; H01L 2924/1434–1453; H01L 25/105; H01L 25/50; H01L 25/0657; H10B 43/20; H10B 41/27; H10B 43/27; H10B 41/10; H10B 43/10; H10B 43/50; H10B 41/50; H10B 41/20
See application file for complete search history.

(56) References Cited

U.S. PATENT DOCUMENTS

| | | |
|---|---|---|
| 9,859,363 B2 | 1/2018 | Lu et al. |
| 10,355,010 B2 | 7/2019 | You et al. |

(Continued)

*Primary Examiner* — Moazzam Hossain
(74) *Attorney, Agent, or Firm* — Myers Bigel, P.A.

(57) ABSTRACT

A semiconductor device includes a first substrate structure including a substrate, circuit elements, and first bonding metal layers, and a second substrate structure connected to the first substrate structure. The second substrate structure includes a plate layer, gate electrodes stacked in a first direction below the plate layer, separation regions penetrating through the gate electrodes and extending in a second direction and spaced apart from each other in the second direction, an insulating region extending from an upper surface of the plate layer and penetrating through the plate layer and at least one of the gate electrodes between the separation regions, and second bonding metal layers connected to the first bonding metal layers. The insulating region has inclined side surfaces such that a width of the insulating region decreases in a direction toward the first substrate structure.

20 Claims, 24 Drawing Sheets

(56) References Cited

U.S. PATENT DOCUMENTS

| | | | |
|---|---|---|---|
| 10,559,583 B2 | 2/2020 | Park et al. | |
| 10,566,345 B2 | 2/2020 | Kanamori et al. | |
| 10,665,601 B2 | 5/2020 | Lee | |
| 10,727,244 B2 | 7/2020 | Hwang et al. | |
| 10,818,684 B2 | 10/2020 | Cheon et al. | |
| 11,508,749 B2 * | 11/2022 | Takimoto | G11C 16/24 |
| 2014/0141610 A1 | 5/2014 | Jin et al. | |
| 2018/0122742 A1 * | 5/2018 | Ha | H10B 43/27 |
| 2020/0035702 A1 | 1/2020 | Lee et al. | |
| 2020/0266146 A1 * | 8/2020 | Nishida | H10B 43/20 |
| 2020/0388336 A1 | 12/2020 | Yun et al. | |
| 2021/0375848 A1 * | 12/2021 | Zhou | H01L 24/09 |
| 2021/0391351 A1 * | 12/2021 | Takimoto | H10B 41/10 |

* cited by examiner

SEMICONDUCTOR DEVICES AND DATA STORAGE SYSTEMS INCLUDING THE SAME

CROSS-REFERENCE TO RELATED APPLICATION(S)

This application claims benefit of priority to Korean Patent Application No. 10-2021-0060059, filed on May 10, 2021 in the Korean Intellectual Property Office, the disclosure of which is incorporated herein by reference in its entirety.

BACKGROUND

The present disclosure relates to semiconductor devices and data storage systems including the same.

In a data storage system requiring data storage, there is increasing demand for a semiconductor device which may store high-capacity data. Accordingly, research into methods of increasing data storage capacity of a semiconductor device has been conducted. For example, a semiconductor device including three-dimensionally arranged memory cells, rather than two-dimensionally arranged memory cells, has been proposed as a method of increasing data storage capacity of a semiconductor device.

SUMMARY

Example embodiments provide a semiconductor device having improved reliability.

Example embodiments provide a data storage system including a semiconductor device having improved reliability.

According to an example embodiment, a semiconductor device includes: a first substrate structure including a substrate, circuit elements on the substrate, a first interconnection structure on the circuit elements, and first bonding metal layers on the first interconnection structure; and a second substrate structure on the first substrate structure and connected to the first substrate structure. The second substrate structure includes: a plate layer; gate electrodes spaced apart from each other and stacked in a first direction, perpendicular to a lower surface of the plate layer, below the plate layer and including first gate electrodes, second gate electrodes, and third gate electrodes sequentially disposed from the plate layer; first gate dielectric layers extending along upper surfaces and lower surfaces of the gate electrodes; channel structures penetrating through the gate electrodes and extending in the first direction, each of the channel structures including a channel layer; first separation regions penetrating through the gate electrodes and extending in the first direction and a second direction, perpendicular to the first direction, and spaced apart from each other in a third direction, perpendicular to the first direction and the second direction; second separation regions penetrating through the gate electrodes between the first separation regions, extending in the first direction and the second direction, and spaced apart from each other in the second direction in at least one region; an insulating region extending from an upper surface of the plate layer and penetrating through the plate layer and the first gate electrodes, between the second separation regions; a second interconnection structure below the channel structures and the gate electrodes; and second bonding metal layers below the second interconnection structure and connected to the first bonding metal layers. The insulating region is in contact with side surfaces of the first gate electrodes and side surfaces of the first gate dielectric layers in contact with the first gate electrodes.

According to an example embodiment, a semiconductor device includes: a first substrate structure including a substrate, circuit elements disposed on the substrate, and first bonding metal layers disposed on the circuit elements; and a second substrate structure disposed on the first substrate structure and connected to the first substrate structure. The second substrate structure includes: a plate layer; gate electrodes spaced apart from each other and stacked in a first direction, perpendicular to a lower surface of the plate layer, below the plate layer; separation regions penetrating through the gate electrodes and extending in a second direction, perpendicular to the first direction, and spaced apart from each other in the second direction in at least one region; an insulating region extending from an upper surface of the plate layer and penetrating through the plate layer and at least one of the gate electrodes between the separation regions; and second bonding metal layers disposed below the gate electrodes and connected to the first bonding metal layers. The insulating region has inclined side surfaces such that a width of the insulating region decreases in a direction toward the first substrate structure.

According to an example embodiment, a data storage system includes: a semiconductor storage device including a first substrate structure including circuit elements and first bonding metal layers, a second substrate structure including channel structures and second bonding metal layers connected to the first bonding metal layers, and an input/output pad electrically connected to the circuit elements; and a controller electrically connected to the semiconductor storage device through the input/output pad and configured to control the semiconductor storage device. The second substrate structure further includes: a plate layer; gate electrodes spaced apart from each other and stacked in a first direction, perpendicular to a lower surface of the plate layer, below the plate layer; separation regions penetrating through the gate electrodes and extending in a second direction, perpendicular to the first direction, and spaced apart from each other in the second direction in at least one region; and an insulating region extending from an upper surface of the plate layer and penetrating through the plate layer and at least one of the gate electrodes between the separation regions. The insulating region has side surfaces that are inclined relative to the first direction such that a width of the insulating region decreases in a direction toward the first substrate structure.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

In the descriptions below, terms "upper," "upper portion," "upper surface," "lower," "lower portion," "lower surface," "side surface," and the like, are used with reference to the drawings unless otherwise indicated.

Figure 1A:
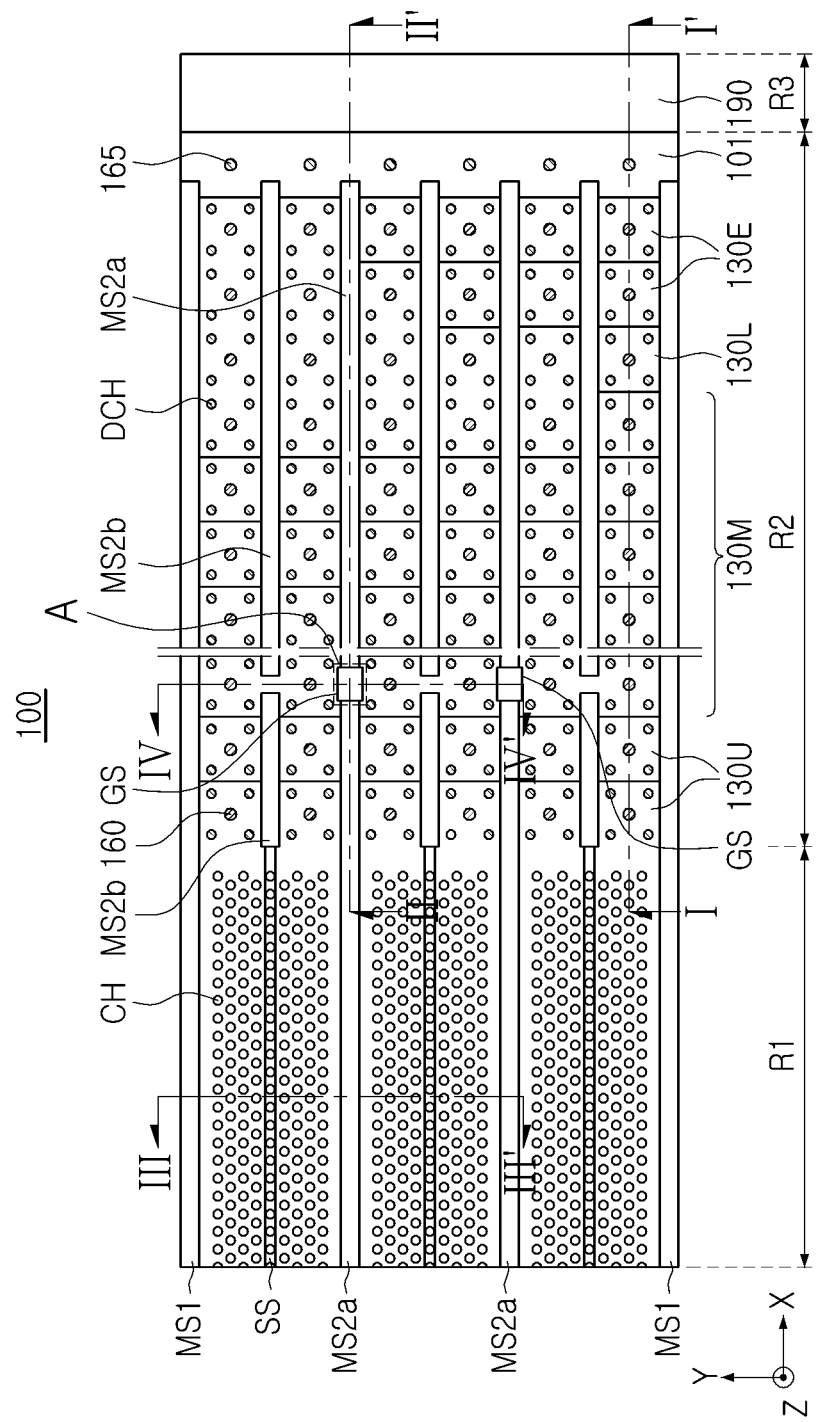
FIGS. 1A and 1B are schematic plan views of a semiconductor device according to example embodiments.
Figure 1B:
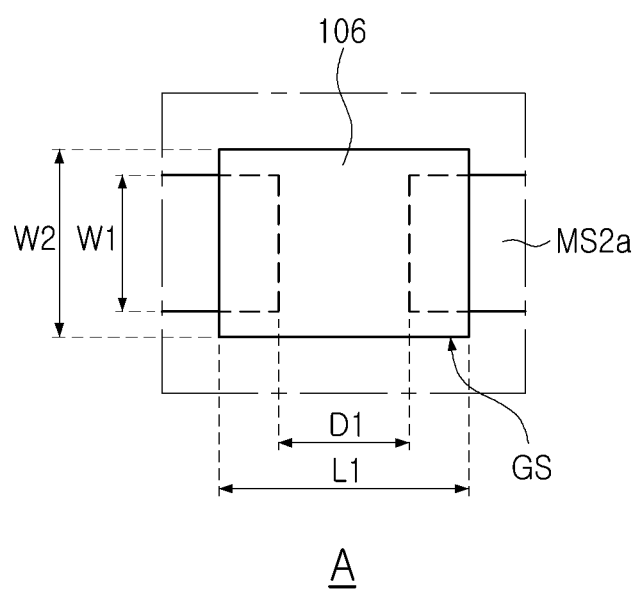

FIGS. 1A and 1B are schematic plan views of a semiconductor device according to example embodiments. FIG. 1B is an enlarged view of region "A" of FIG. 1A.

FIGS. 2A to 2D are schematic cross-sectional views of a semiconductor device according to example embodiments. FIGS. 2A to 2D illustrate cross-sections taken along lines I-I', II-II', III-III', and IV-IV' of FIG. 1A, respectively.

Figure 2A:
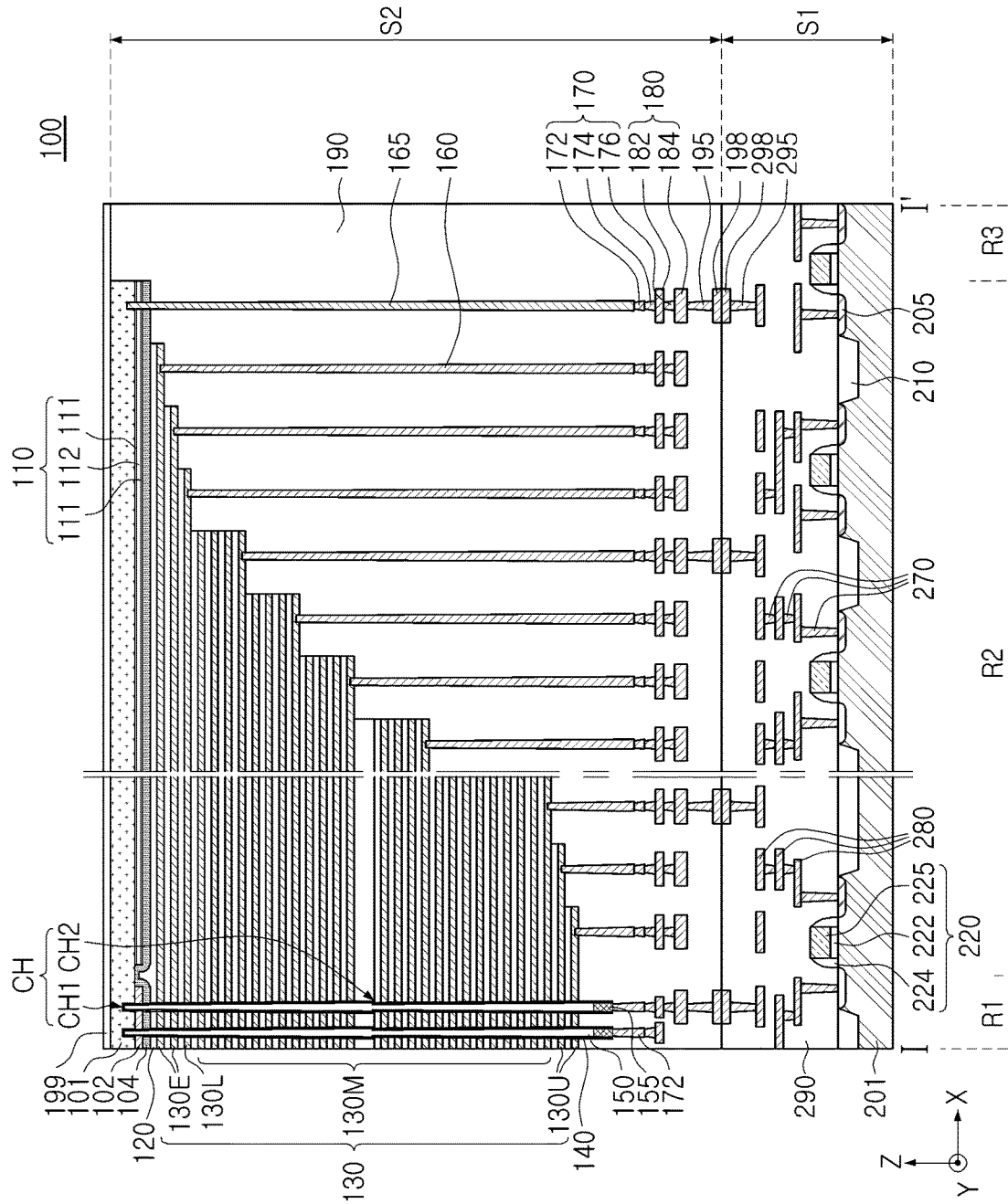
FIGS. 2A to 2D are schematic cross-sectional views of a semiconductor device according to example embodiments.
Figure 2C:
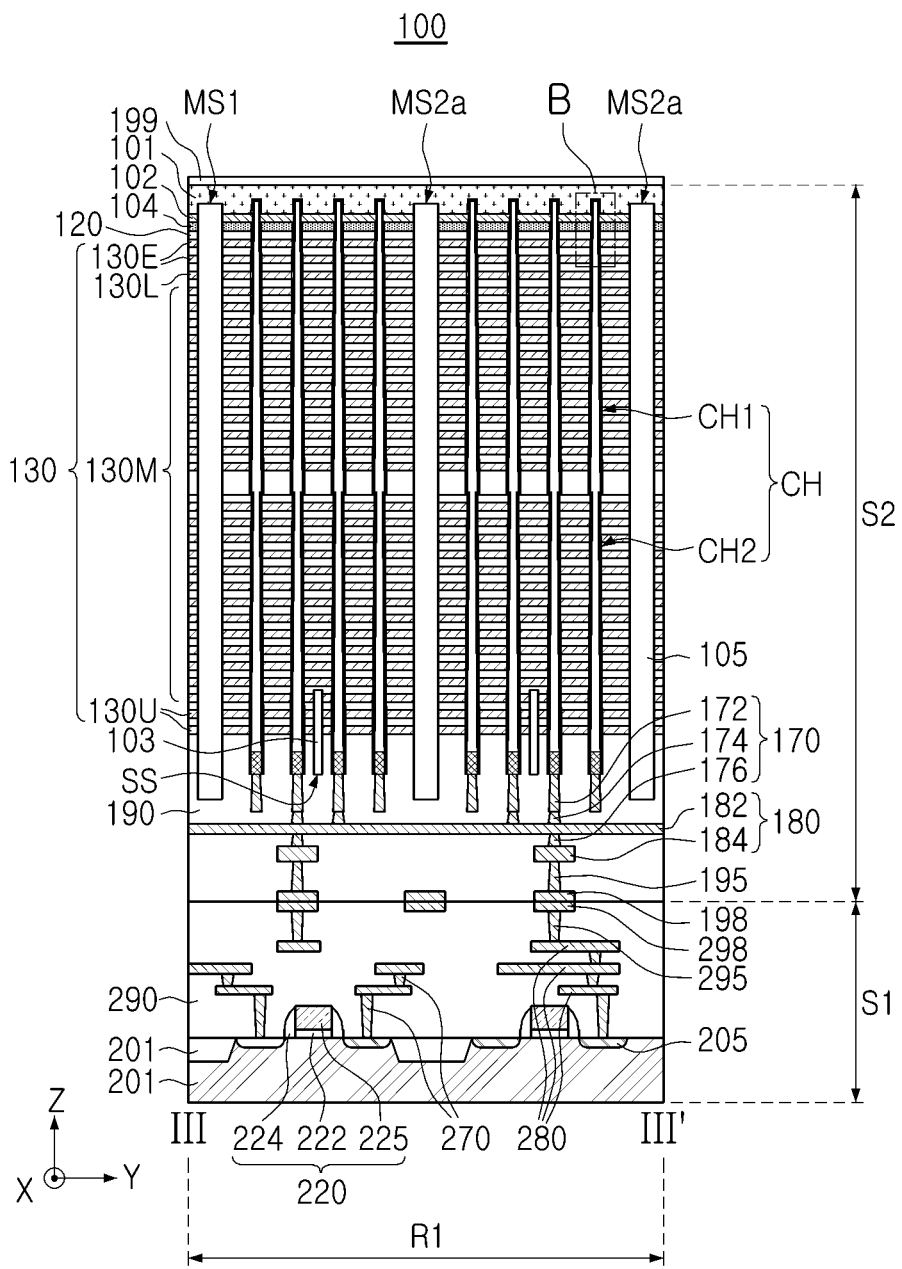
Figure 2D:
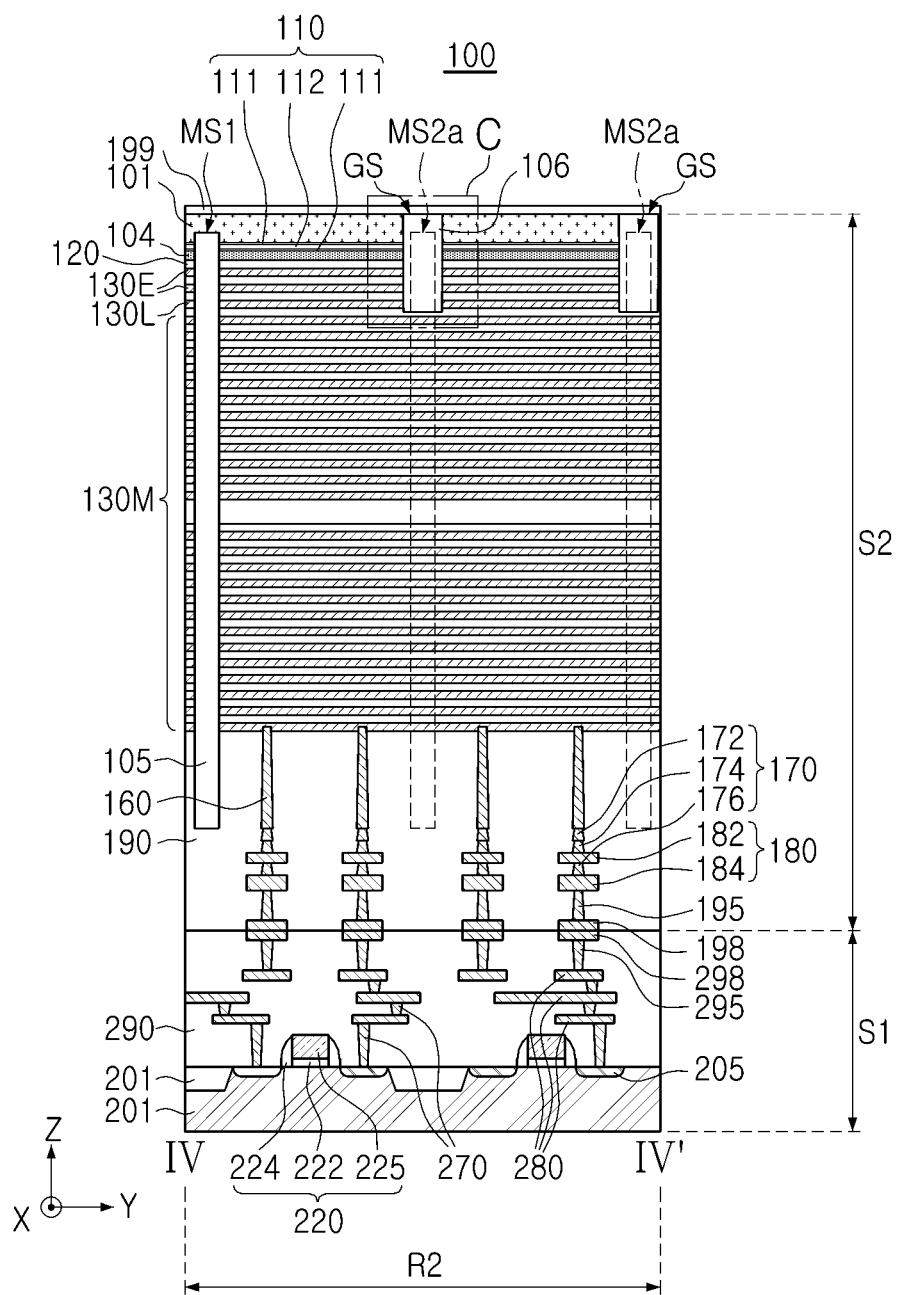
Figure 3A:
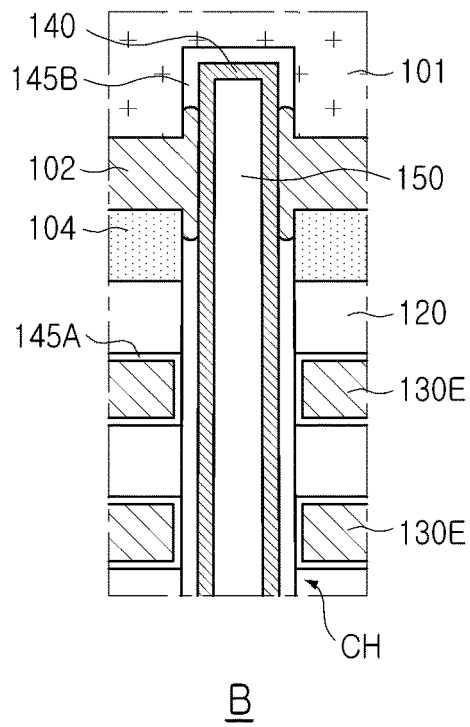
FIGS. 3A and 3B are partially enlarged views of a semiconductor device according to example embodiments.
Figure 3B:
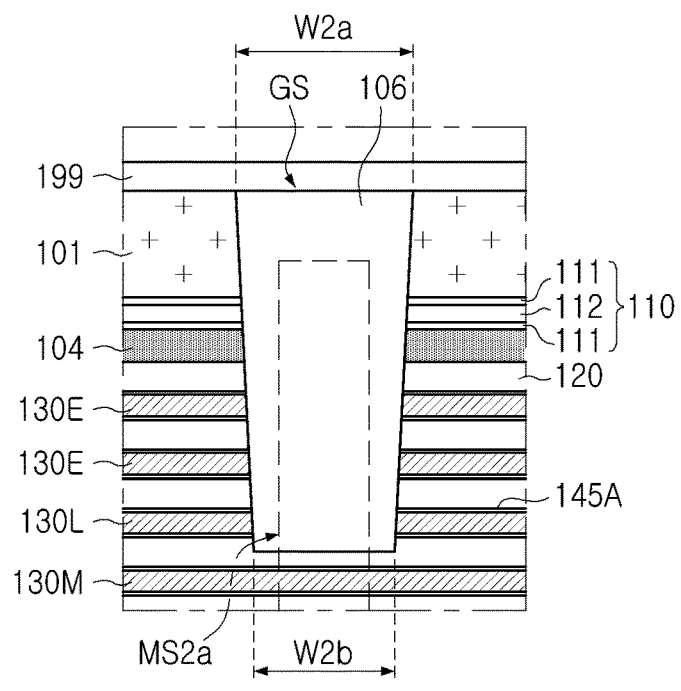

FIGS. 3A and 3B are partially enlarged views of a semiconductor device according to example embodiments. FIG. 3A is an enlarged view of region "B" of FIG. 2C, and FIG. 3B is an enlarged view of region "C" of FIG. 2D.

Referring to FIGS. 1A to 3B, a semiconductor device 100 may include a first substrate structure S1 and a second substrate structure S2 stacked vertically. For example, the first substrate structure S1 may include a peripheral circuit region of the semiconductor device 100, and the second substrate structure S2 may include a memory cell region of the semiconductor device 100. FIG. 1A illustrates a plane in a direction in which the second substrate structure S2 is viewed from an interface between the first and second substrate structures S1 and S2.

The first substrate structure S1 may include a substrate 201, source/drain regions 205 and device isolation layers 210 in the substrate 201, and circuit elements 220 disposed on the substrate 201, circuit contact plugs 270, circuit interconnection lines 280, a peripheral region insulating layer 290, first bonding vias 295, and first bonding metal layers 298.

The substrate 201 may have an upper surface extending in an X direction and a Y direction. The device isolation layers 210 may be formed on the substrate 201 to define an active region. Source/drain regions 205, including impurities, may be disposed in a portion of the active region. The substrate 201 may include a semiconductor material, for example, a group IV semiconductor, a group III-V compound semiconductor, or a group II-VI compound semiconductor. For example, the substrate 201 may be provided as a single-crystalline bulk wafer.

The circuit elements 220 may include planar transistors. Each of the circuit elements 220 may include a circuit gate dielectric layer 222, spacer layers 224, and a circuit gate electrode 225. The source/drain regions 205 may be disposed in the substrate 201 on opposite sides adjacent to the circuit gate electrode 225.

The peripheral region insulating layer 290 may be disposed on the circuit element 220 on the substrate 201. The circuit contact plugs 270 and the peripheral region insulating layer 290 may constitute a first interconnection structure of the first substrate structure S1. The circuit contact plugs 270 may have a cylindrical shape and may be connected to the source/drain regions 205 through the peripheral region insulating layer 290. An electrical signal may be applied to the circuit element 220 by the circuit contact plugs 270. In a region, not illustrated, the circuit contact plugs 270 may also be connected to the circuit gate electrode 225. The circuit interconnection lines 280 may be connected to the circuit contact plugs 270, may have a line shape, and may be disposed in a plurality of layers. The number of layers of the circuit contact plugs 270 and the circuit interconnection lines 280 may vary according to example embodiments.

The first bonding vias 295 and the first bonding metal layers 298 may constitute a first bonding structure and may be disposed on a portion of uppermost circuit interconnection lines 280. The first bonding vias 295 may have a cylindrical shape, and the first bonding metal layers 298 may have a line shape. Upper surfaces of the first bonding metal layers 298 may be exposed to an upper surface of the first substrate structure S1. The first bonding vias 295 and the first bonding metal layers 298 may function as a bonding structure or a bonding layer of the first substrate structure S1 and the second substrate structure S2. In addition, the first bonding vias 295 and the first bonding metal layers 298 may provide a path for electrical connection to the second substrate structure S2. In example embodiments, some of the first bonding metal layers 298 may be only disposed for bonding without being connected to the lower circuit interconnection lines 280, as illustrated in FIG. 2C. The first bonding vias 295 and the first bonding metal layers 298 may include a conductive material, for example, copper (Cu).

In example embodiments, the peripheral region insulating layer 290 may include a bonding insulating layer having a predetermined thickness from an upper surface thereof. The bonding insulating layer may be a layer for dielectric-to-dielectric bonding to the bonding insulating layer of the second substrate structure S2. The bonding insulating layer may also function as a diffusion barrier layer of the first bonding metal layers 298 and may include, for example, at least one of SiO, SiN, SiCN, SiOC, SiON, and SiOCN.

The second substrate structure S2 may include a plate layer 101 having a first region R1 and a second region R2, first and second horizontal conductive layers 102 and 104 on a lower surface of the plate layer 101, gate electrodes 130 stacked on lower surfaces of the gate electrodes 130, interlayer insulating layers 120 stacked alternately with the gate electrodes 130, channel structures CH disposed to penetrate through the gate electrodes 130, first and second separation regions MS1, MS2a, and MS2b extending in one direction through the gate electrodes 130, and first insulating regions GS penetrating through some of the gate electrodes 130. The second substrate structure S2 may further include a horizontal insulating layer 110 disposed in parallel to the first horizontal conductive layer 102 in the second region R2, second insulating regions SS penetrating through some of the gate electrodes 130, a cell region insulating layer 190 covering the gate electrodes 130, and a passivation layer 199 on the plate layer 101. The second substrate structure S2 may further include gate contacts 160, cell contact plugs 170, and cell interconnection lines 180, disposed below the gate electrodes 130 and the channel structures CH, as a second interconnection structure. The second substrate structure S2 may further include second bonding vias 195 and second bonding metal layers 198, as a second bonding structure. The second substrate structure S2 may further have a third region R3 outside of or horizontally offset from the plate layer 101.

The first region R1 of the plate layer 101 may be a region in which the gate electrodes 130 are vertically stacked and the channel structures CH are disposed, and the second region R2 of the plate layer 101 may be a region in which the gate electrodes 130 extend by different lengths and correspond to a region for electrically connecting the memory cells to the first substrate structure S1. The second region R2 may be disposed on or extend from at least one end of the first region R1 in at least one direction, for example, the X direction.

The plate layer 101 may have an upper surface extending in the X direction and the Y direction. The plate layer 101 may include a conductive material. For example, the plate layer 101 may include a semiconductor material such as a group IV semiconductor, a group III-V compound semiconductor, or a group II-VI compound semiconductor. For example, the group IV semiconductor may include silicon, germanium, or silicon-germanium. The plate layer 101 may further include impurities. The plate layer 101 may be provided as a polycrystalline semiconductor layer such as a polycrystalline silicon layer or an epitaxial layer.

The first and second horizontal conductive layers 102 and 104 may be sequentially stacked and disposed on a lower surface of the first region R1 of the plate layer 101. The first horizontal conductive layer 102 may not extend to the second region R2 of the plate layer 101, while the second horizontal conductive layer 104 may extend to the second region R2.

The first horizontal conductive layer 102 may function as a portion of a common source line of the semiconductor device 100, for example, as a common source line together with the plate layer 101. As illustrated in the enlarged view of FIG. 3A, the first horizontal conductive layer 102 may be directly connected to the channel layer 140 on the periphery of the channel layer 140.

The second horizontal conductive layer 104 may be in contact with the plate layer 101 in some regions in which the first horizontal conductive layer 102 and the horizontal insulating layer 110 are not disposed. The second horizontal conductive layer 104 may be bent to extend onto the plate layer 101 while covering an end portion of the first horizontal conductive layer 102 or the horizontal insulating layer 110 in the some regions in which the first horizontal conductive layer 102 and the horizontal insulating layer 110 are not disposed.

The first and second horizontal conductive layers 102 and 104 may include a semiconductor material, for example, both the first and second horizontal conductive layers 102 and 104 may include polycrystalline silicon. In this case, at least the first horizontal conductive layer 102 may be a doped layer, and the second horizontal conductive layer 104 may be a doped layer or a layer containing impurities diffused from the first horizontal conductive layer 102. However, in example embodiments, the second horizontal conductive layer 104 may be replaced with an insulating layer.

The horizontal insulating layer 110 may be disposed on the plate layer 101 at the same level as a level of the first horizontal conductive layer 102 in at least a portion of the second region R2. The horizontal insulating layer 110 may include first and second horizontal insulating layers 111 and 112 alternately stacked on the second region R2 of the plate layer 101. The horizontal insulating layer 110 may be a layer that remains after a portion of the horizontal insulating layer 110 is replaced with the first horizontal conductive layer 102, in a fabricating process of the semiconductor device 100.

The horizontal insulating layer 110 may include silicon oxide, silicon nitride, silicon carbide, or silicon oxynitride. The first horizontal insulating layers 111 and the second horizontal insulating layer 112 may include different insulating materials. For example, the first horizontal insulating layers 111 may be formed of the same material as the interlayer insulating layers 120, and the second horizontal insulating layer 112 may be formed of a material different from that of the interlayer insulating layers 120.

The gate electrodes 130 may be vertically spaced apart from each other and stacked on a lower surface of the plate layer 101 to form a stack structure together with the interlayer insulating layers 120. The stack structure may include lower and upper stack structures stacked vertically. However, in example embodiments, the stack structure may include a single stack structure.

The gate electrodes 130 may include erase gate electrodes 130E constituting an erase control transistor used for an erase operation, at least one lower gate electrode 130L constituting a gate of a ground select transistor, memory gate electrodes 130M constituting a plurality of memory cells, and upper gate electrodes 130U constituting gates of the string select transistors. The lower gate electrode 130L and the upper gate electrodes 130U may be referred to as "lower" and "upper" based on a direction during the fabricating process. The number of memory gate electrodes 130M, constituting memory cells, may be determined depending on the capacity of the semiconductor device 100. According to example embodiments, the upper and lower gate electrodes 130U and 130L and the erase gate electrodes 130E may each include one to four or more gate electrodes and may have a structure the same as or different from structures of the memory gate electrodes 130M. The erase gate electrodes 130E may be disposed on the lower gate electrode 130L and may be used for an erase operation using a gate-induced drain leakage (GIDL) current. In example embodiments, the erase gate electrodes 130E may be further disposed below the upper gate electrodes 130U. Some of the gate electrodes 130, for example, memory gate electrodes 130M adjacent to the upper or lower gate electrodes 130U and 130L, may be dummy gate electrodes.

The gate electrodes 130 may be vertically spaced apart from each other and stacked on the lower surface of the plate layer 101 and may extend by different lengths in at least one direction to form a step or stepped structure having a staircase shape. The gate electrodes 230 may be disposed to form a step as illustrated in FIG. 2A in the X direction and to form a step in the Y direction as well. The step may cause predetermined regions, including end portions of the gate electrodes 130, to be exposed. The gate electrodes 130 may be connected to the gate contacts 160 in the above regions.

The gate electrodes 130 may be disposed such that at least some of the gate electrodes 130 are separated in predetermined units by the first and second separation regions MS1, MS2a, and MS2b in the Y direction. The gate electrodes 130 may constitute a single memory block between a pair of first separation regions MS1 adjacent to each other, but the scope of the memory block is not limited thereto.

The interlayer insulating layers 120 may be disposed between the gate electrodes 130. Similar to the gate electrodes 130, the interlayer insulating layers 120 may be spaced apart from each other in a direction, perpendicular to the lower surface of the plate layer 101, and may be disposed to extend in the X direction. The interlayer insulating layers 120 may include an insulating material such as silicon oxide or silicon nitride.

The channel structures CH may be disposed to be spaced apart from each other in rows and columns on the lower surface of the plate layer 101 in the first region R1 of the plate layer 101. The channel structures CH may be disposed to form a grid pattern or may be disposed in a zigzag form in one direction. The channel structures CH may have a columnar shape and may have inclined side surfaces narrowing in a direction toward the plate layer 101 depending on an aspect ratio.

Each of the channel structures CH may have a form in which first and second channel structures CH1 and CH2, respectively penetrating through the upper and lower stack structures of the gate electrodes 130, are connected to each other and may have a bent portion formed by a difference or change in width in a connection region. In example embodiments, some of the channel structures CH may be dummy channels and, as illustrated in FIG. 1A, dummy channels DCH may be further disposed in the second region R2 outside of the channel structures CH.

As illustrated in the enlarged view of FIG. 3A, the channel layer 140 may be disposed in the channel structures CH. In the channel structures CH, the channel layer 140 may be formed to have an annular shape surrounding a channel filling insulating layer 150 therein. However, the channel layer 140 may have a columnar shape without the channel filling insulating layer 150, such as a cylindrical shape or a prismatic shape, according to example embodiments. The channel layer 140 may be connected to the first horizontal conductive layer 102 in a portion disposed therebelow. The channel layer 140 may include a semiconductor material such as polycrystalline silicon or single-crystalline silicon. The channel layer 140 may further include impurities by doping in a region, at the same level as a level of the erase gate electrodes 130E.

The first and second gate dielectric layers 145A and 145B may be disposed between the gate electrodes 130 and the channel layer 140. The first gate dielectric layer 145A may extend horizontally along upper and lower surfaces of the gate electrodes 130 and may cover side surfaces of the gate electrodes 130 facing the channel structure CH. The second gate dielectric layer 145B may extend vertically along the channel layer 140. Although not illustrated in detail, the second gate dielectric layer 145B may include a tunneling layer, a charge storage layer, and a portion of a blocking layer sequentially stacked from the channel layer 140, and the first gate dielectric layer 145A may include another portion of the blocking layer. The tunneling layer may allow charges to tunnel charges to the charge storage layer and may include, for example, silicon oxide ($SiO_2$), silicon nitride ($Si_3N_4$), silicon oxynitride (SiON), or combinations thereof. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material, or combinations thereof.

A channel pad 155 may be only disposed on a lower end of the lower second channel structure CH2. The channel pads 155 may include, for example, doped polycrystalline silicon. However, in example embodiments, each of the first and second channel structures CH1 and CH2 may include a channel pad 155. In this case, the channel pad 155 of the first channel structure CH1 may be connected to the channel layer 140 of the second channel structure CH2.

The channel layer 140, the first and second gate dielectric layers 145A and 145B, and the channel filling insulating layer 150 may be connected to each other between the first channel structure CH1 and the second channel structure CH2. An interlayer insulating layer 120 having a relatively high thickness may be further disposed between the first channel structure CH1 and the second channel structure CH2. However, a shape of each of the interlayer insulating layers 120 may vary according to example embodiments.

The first and second separation regions MS1, MS2a, and MS2b may be disposed to extend in the X direction through the gate electrodes 130. The first and second separation regions MS1, MS2a, and MS2b may be disposed to be parallel to each other. The first and second separation regions MS1, MS2a, and MS2b may be connected to the plate layer 101 through the entire gate electrodes 130 stacked on the plate layer 101. The first separation regions MS1 extend as a single layer in the X direction, and the second separation regions MS2a and MS2b may intermittently extend between a pair of first separation regions MS1 or may only be disposed in some regions. Specifically, the second separation regions MS2a and MS2b may include second intermediate separation regions MS2a and second auxiliary separation regions MS2b disposed between the first separation region MS1 and the second intermediate separation regions MS2a. The second intermediate separation regions MS2a may be disposed over the first region R1 and the second region R2, and the second auxiliary separation regions MS2b may only be disposed in the second region R2. The second intermediate separation regions MS2a may be disposed to be spaced apart from each other in the X direction in the second region R2. A shape, in which the second separation regions MS2a and MS2b are spaced apart from each other in the second region R2, may vary according to example embodiments. In addition, in example embodiments, the arrangement order, the number, and the like, of the first and second separation regions MS1, MS2a, and MS2b are not limited to those illustrated in FIG. 1A.

Figure 2B:
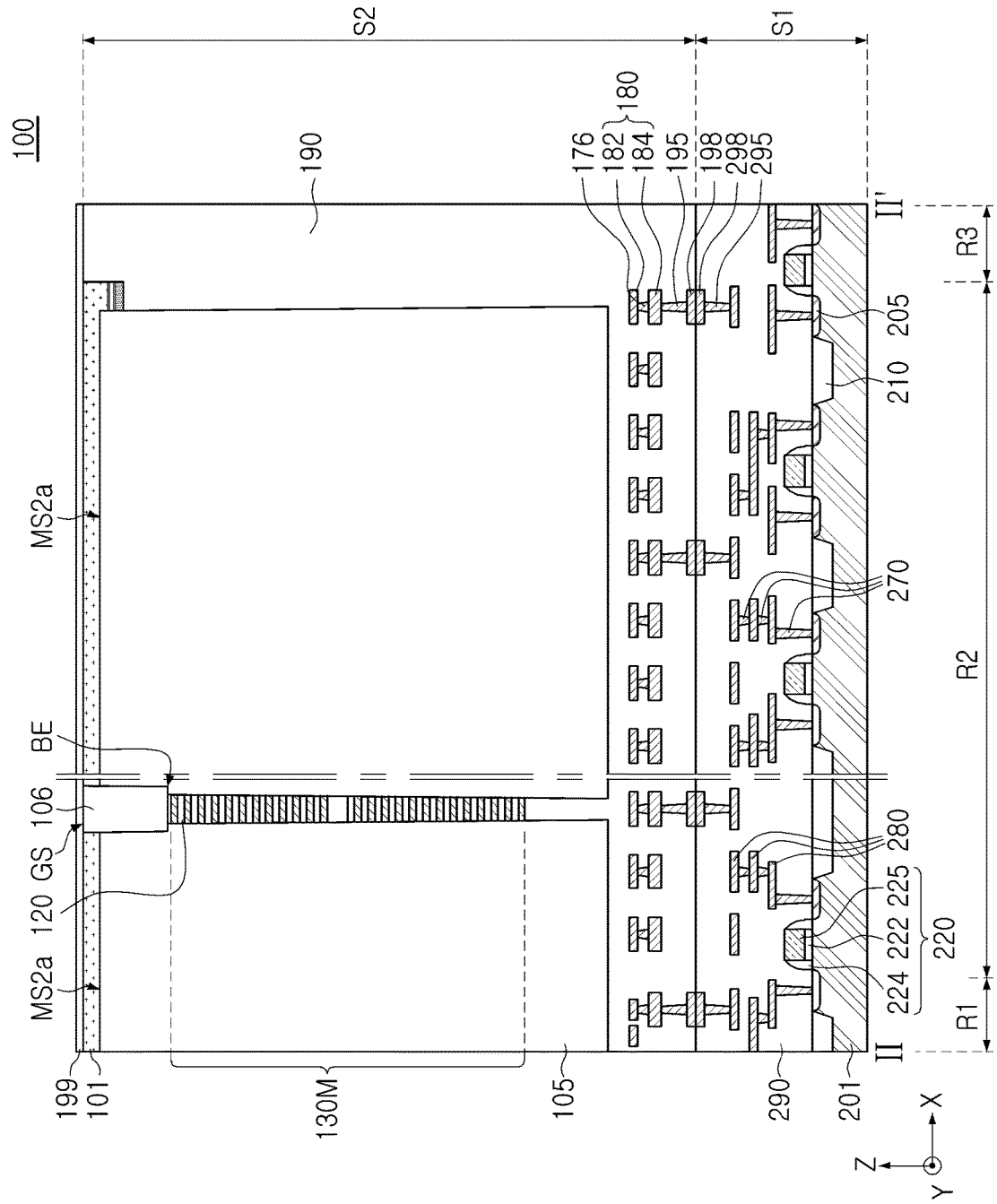

As illustrated in FIGS. 2B and 2D, a separation insulating layer 105 may be disposed in the first and second separation regions MS1, MS2a, and MS2b. The separation insulating layer 105 may have a shape in which a width is decreased in a direction toward the plate layer 101 due to a high aspect ratio, but a shape of the separation insulating layer 105 is not limited thereto. In example embodiments, a conductive layer may be further disposed in the separation insulating layer 105 in the first and second separation regions MS1, MS2a, and MS2b. In this case, the conductive layer may function as a common source line of the semiconductor device 100 or a contact plug connected to a common source line.

The first insulating regions GS may extend from an upper surface of the plate layer 101 to penetrate through the plate layer 101, the horizontal insulating layer 110, the second horizontal conductive layer 104, the erase gate electrodes 130E, the lower gate electrode 130L, some of the interlayer insulating layers 120, and the first gate dielectric layers 145A. As illustrated in FIG. 1A, the first insulating regions GS may be disposed in a region including a region between the second intermediate separation regions MS2a disposed in the X direction, in a plan view. Due to this arrangement, the lower gate electrode 130L may be separated or divided into a plurality of lower gate electrodes by the first insulating region GS and the second intermediate separation regions MS2a, disposed in a line in the X direction, between the pair of first separation regions MS1. This will be described below in more detail with reference to FIG. 4.

As illustrated in FIG. 1B, the first insulating region GS may have a first length L1 greater than or equal to a separation distance D1 between the second intermediate separation regions MS2a in the X direction. The first insulating region GS may have a second width W2 equal to or different from a first width W1 of the second intermediate separation regions MS2a in the Y direction. For example, the second width W2 may be greater than the first width W1, but example embodiments are not limited thereto.

As illustrated in FIG. 2B, portions of both side surfaces in the X direction and lower surfaces of the first insulating regions GS may be in contact with the second intermediate separation regions MS2a. The first insulating regions GS are formed by removing a portion of the separation insulating layer 105 of the second central separation regions MS2a from the upper portion thereof. Thus, in the second intermediate separation regions MS2a, a bent portion BE may be formed along lower ends of the first insulating regions GS in a region in contact with the first insulating regions GS. The first insulating layer 106 may be disposed in the first insulating region GS. The first insulating layer 106 may include an insulating material, for example, silicon oxide, silicon nitride, or silicon oxynitride.

As illustrated in FIG. 3B, the first insulating region GS may have side surfaces inclined such that a width of the first insulating region GS narrows in a direction toward the first substrate structure S1. The first insulating region GS may have side surfaces inclined or tapered in a direction, opposing the channel structures CH, the first and second separation regions MS1, MS2a, and MS2b, the second interconnection structure, and the second bonding structure. The first insulating region GS may have an upper width W2a in an upper portion thereof and a lower width W2b, smaller than the upper width W2a, in a lower portion thereof. The upper width W2a may be in the range of, for example, about 80 nm to about 150 nm and in the range of, for example, about 100 nm to about 120 nm.

The first insulating region GS may be disposed to completely penetrate through the lower gate electrode 130L from the plate layer 101 such that a lower end thereof is disposed in the interlayer insulating layer 120 below the lower gate electrode 130L. For example, when gate electrodes 130 above the memory gate electrodes 130M are referred to as first gate electrodes, the memory gate electrodes 130M are referred to as second gate electrodes, and gate electrodes below the memory gate electrodes 130M are referred to as third gate electrodes, the first insulating region GS may be disposed to penetrate through at least some of the first gate electrodes.

Side surfaces of the lower gate electrode 130L and the erase gate electrodes 130E, through which the first insulating region GS penetrates, may be exposed through the first insulating region GS to be in direct contact with the first insulating layer 106. Side surfaces of the first gate dielectric layers 145A on upper and lower surfaces of the lower gate electrode 130L and the erase gate electrodes 130E may be exposed through the first insulating region GS to be in direct contact with the first insulating layer 106. In the gate electrodes 130, a side surface facing the channel structure CH may be covered with the first gate dielectric layers 145A as illustrated in FIG. 3A, whereas a side surface facing the first insulating region GS may not be covered with the first gate dielectric layers 145A as illustrated in FIG. 3B. This may be because the first insulating region GS is formed after the first gate dielectric layers 145A and the gate electrodes 130 are formed. In addition, the gate electrodes 130 below the first insulating region GS including the memory gate electrodes 130M may have planar or flat upper and lower surfaces and may extend below the first insulating region GS.

In the case of the present embodiment, the first insulating region GS may be formed from the upper surface of the plate layer 101 after the first and second substrate structures S1 and S2 may be bonded. Accordingly, since a shape of the gate electrodes 130 is not affected by the first insulating region GS, the gate electrodes 130 may have planar or flat upper and lower surfaces below the first insulating region GS. Therefore, unlike the case in which the first insulating region GS is formed before the gate electrodes 130 are formed, a gull-shaped depression may be prevented from being formed in the gate electrodes 130. As a result, defects such as short-circuit, leakage current, and the like, of the gate electrodes 130 may be prevented from occurring due to the depression.

In the first region R1, the second insulating regions SS may extend in the X direction between the first separation region MS1 and the second intermediate separation region MS2a and between the second intermediate separation regions MS2a, as illustrated in FIG. 1A. The second insulating regions SS may be disposed to penetrate through some of the gate electrodes 130 including an upper gate electrode 130U, among the gate electrodes 130, for example, at least some of the third gate electrodes. The second insulating regions SS may separate a total of three gate electrodes 130 including, for example, upper gate electrodes 130U, from each other in the Y direction, as illustrated in FIG. 2C. However, the number of gate electrodes 130 separated by the second insulating regions SS may vary according to example embodiments. The upper gate electrodes 130U, separated by the second insulating regions SS, may constitute different string select lines. The second insulating layer 103 may be disposed in the second insulating regions SS. The second insulating layer 103 may include an insulating material, for example, silicon oxide, silicon nitride, or silicon oxynitride.

The cell region insulating layer 190 may be disposed to cover the plate layer 101 and the gate electrodes 130 on a lower surface of the plate layer 101. The cell region insulating layer 190 may be formed of an insulating material and may include a plurality of insulating layers.

The passivation layer 199 may be disposed on the upper surface of the plate layer 101. The passivation layer 199 may serve to protect the semiconductor device 100. In example embodiments, the passivation layer 199 may have an opening in some regions, so that a pad region connected to an external element may be defined. The passivation layer 199 may include at least one of silicon oxide, silicon nitride, and silicon carbide.

The second interconnection structure may include gate contacts 160, a substrate contact 165, a cell contact plugs 170, and cell interconnection lines 180, and the second substrate structure S2 may be configured to be electrically connected to the substrate structure S1.

The gate contacts 160 may be connected to the gate electrodes 130 through the cell region insulating layer 190. The substrate contact 165 may be connected to the plate layer 101.

The cell contact plugs 170 may include first to third cell contact plugs 172, 174, and 176, and the cell interconnection lines 180 may include first and second cell interconnection lines 182 and 184. The channel pads 155, the gate contacts 160, and the substrate contact 165 may be connected to the first cell contact plugs 172 on a lower end thereof. The first cell contact plugs 172 may be connected to the second cell contact plugs 174 on the lower end thereof, and the second cell contact plugs 174 may be connected to the first cell interconnection line 182 on the lower end thereof. The third cell contact plugs 176 may vertically connect the first and second cell interconnection lines 182 and 184 to each other. The cell contact plugs 170 may have a cylindrical shape. The cell contact plugs 170 may have different lengths. For example, each of the first cell contact plugs 172 may have a relatively large length. In example embodiments, each of the cell contact plugs 170 may have a surface inclined such that a width is decreased in a direction toward the plate layer 101 and increased in a direction toward the first substrate structure S1. According to example embodiments, some of the cell contact plugs 170 may be dummy contact plugs to which an electrical signal is not applied.

The first cell interconnection lines 182 may include bitlines of the first region R1, connected to the channel structures CH, and interconnection lines of the second region R2 disposed on the same level as the bitlines. The second cell interconnection lines 184 may be interconnection lines disposed below the first cell interconnection lines 182. The cell interconnection lines 180 may have a line shape extending in at least one direction. In example embodiments, the second cell interconnection lines 184 may have a thickness larger than a thickness of the first cell interconnection lines 182. Each of the cell interconnection lines 180 may have a side surface inclined side such that a width is decreased in a direction toward the plate layer 101.

The gate contacts 160, the substrate contact 165, the cell contact plugs 170, and the cell interconnection lines 180 may include, for example, tungsten (W), aluminum (Al), copper (Cu), tungsten nitride (WN), tantalum nitride (TaN), titanium nitride (TiN), or combinations thereof.

The second substrate structure S2 may further include through-vias connected to the underlying second interconnection structure through the plate layer 101 in a region, not illustrated.

The second bonding vias 195 of the second bonding structure are disposed below the second cell interconnection lines 184 to be connected to the second cell interconnection lines 184, and the second bonding vias 195 of the second bonding structure may be connected to the second cell interconnection lines 184. The bonding metal layers 198 may be connected to the second bonding vias 195. A lower surface of the second bonding metal layers 198 may be exposed to a lower surface of the second substrate structure S2. The second bonding metal layers 198 may be bonded and connected to the first bonding metal layers 298 of the first substrate structure S1. The second bonding vias 195 and the second bonding metal layers 198 may include a conductive material, for example, copper (Cu).

In example embodiments, the cell region insulating layer 190 may include a bonding insulating layer having a predetermined thickness from a lower surface thereof. In this case, the bonding insulating layer may form dielectric-to-dielectric bonding to the bonding insulating layer of the first substrate structure S1. The bonding insulating layer may include at least one of, for example, SiO, SiN, SiCN, SiOC, SiON, and SiOCN.

The first and second substrate structures S1 and S2 may be bonded by bonding the first bonding metal layers 298 and the second bonding metal layers 198 and bonding the bonding insulating layers. The bonding of the first bonding metal layers 298 and the second bonding metal layers 198 may be, for example, copper-to-copper (Cu-to-Cu) bonding, and the bonding of the bonding insulating layers may be, for example, dielectric-to-dielectric bonding such as SiCN-to-SiCN bonding. The first and second substrate structures S1 and S2 may be bonded by hybrid bonding including copper-to-copper (Cu-to-Cu) bonding and dielectric-to-dielectric bonding.

Figure 4:
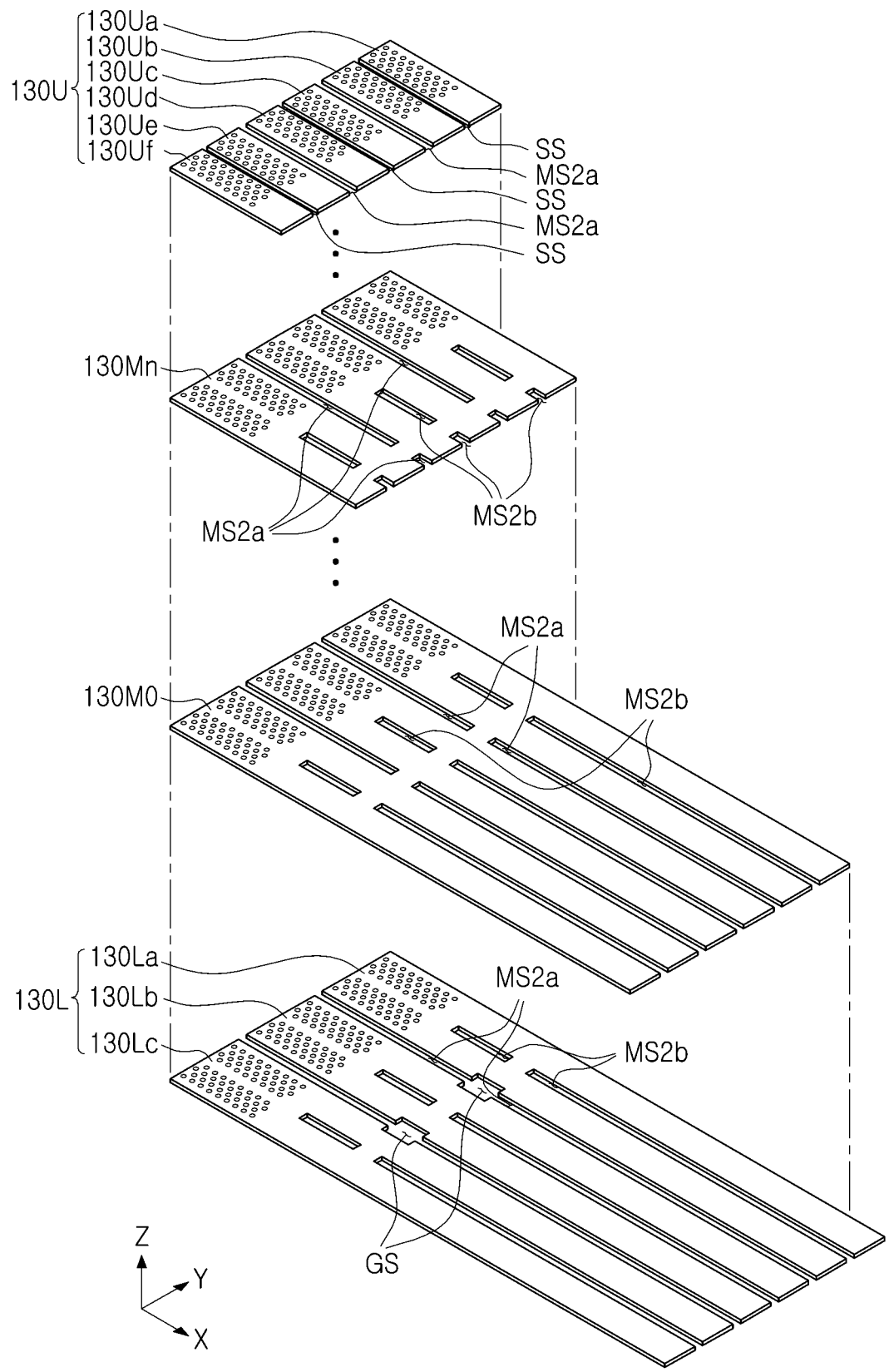
FIG. 4 is an exploded perspective view illustrating gate electrodes of a semiconductor device according to example embodiments.

FIG. 4 is an exploded perspective view illustrating gate electrodes of a semiconductor device according to example embodiments.

Referring to FIG. 4, some of the gate electrodes 130 disposed between the pair of first separation regions MS1 of FIG. 1A are illustrated. In FIG. 4, the gate electrodes 130 are illustrated as being disposed in a direction opposing the direction in which the gate electrodes 130 illustrated in FIG. 2A are stacked.

Among the gate electrodes 130, an upper gate electrode 130U disposed in an uppermost portion (a lowermost portion in FIG. 2A) may be used as a string select line. The upper gate electrode 130U may be divided into six sub-upper gate electrodes 130Ua, 130Ub, 130Uc, 130SUd, 130Ue, and 130Uf in the Y direction by the second insulating regions SS and the second intermediate separation regions MS2*a*. Each of the sub-upper gate electrodes 130Ua, 130Ub, 130Uc, 130SUd, 130Ue, and 130Uf may be connected to different contact plugs to independently receive an electrical signal. For example, among the gate electrodes 130, two upper gate electrodes 130 disposed on the uppermost portion may correspond to the upper gate electrode 130U, but the number of the upper gate electrodes 130U may vary according to example embodiments.

A memory gate electrode 130Mn, disposed below the upper gate electrode 130U, may have grooves or openings formed by the second separation regions MS2*a* and MS2*b* and may be disposed as a single layer. The lowermost memory gate electrode 130M0 may also have regions through which the second separation regions MS2*a* and MS2*b* penetrate, but may be disposed as a single layer. In FIG. 4, among the memory gate electrodes 130M, only the uppermost memory gate electrode 130Mn and the lowermost memory gate electrode 130M0 are illustrated, but other memory gate electrodes 130M may be similarly disposed to form a single layer, respectively.

Among the gate electrodes 130, the lower gate electrode 130L disposed below the memory gate electrodes 130M may be used as a ground select line and may be divided into three sub-lower gate electrodes 130La, 130Lb, and 130Lc by the first insulating regions GS and the second intermediate separation regions MS2*a*. The first insulating regions GS may be disposed to connect the second intermediate separation regions MS2*a* disposed side by side in the X direction, and thus, the lower gate electrode 130L may be completely divided in the Y direction. Each of the sub-lower gate electrodes 130La, 130Lb, and 130Lc may be connected to different contact plugs to independently receive electrical signals. However, in example embodiments, the number of sub-lower gate electrodes 130La, 130Lb, and 130Lc disposed between the pair of first separation regions MS1 may vary within the range of two or more. Similar to the lower gate electrode 130L, the erase gate electrodes 130E (see FIG. 1A) may also include a plurality of sub-gate electrodes.

Figure 5A:
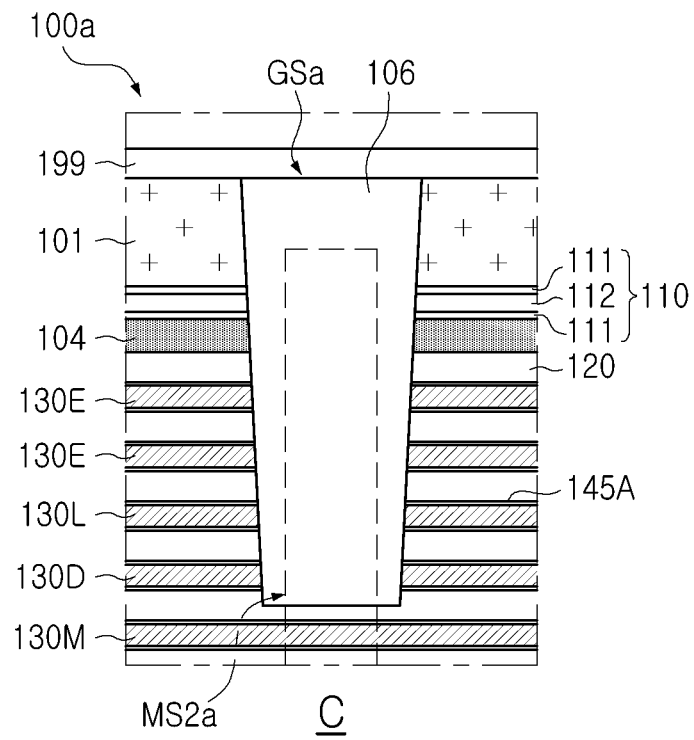
FIGS. 5A to 5C are partially enlarged views illustrating a semiconductor device according to example embodiments.
Figure 5B:
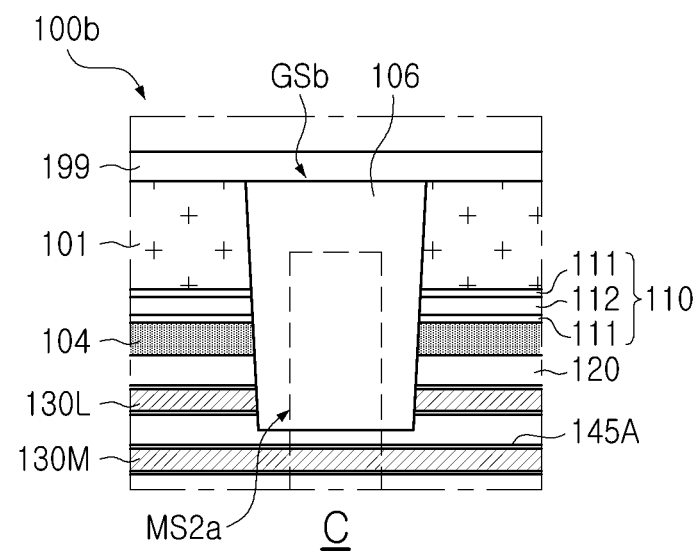
Figure 5C:
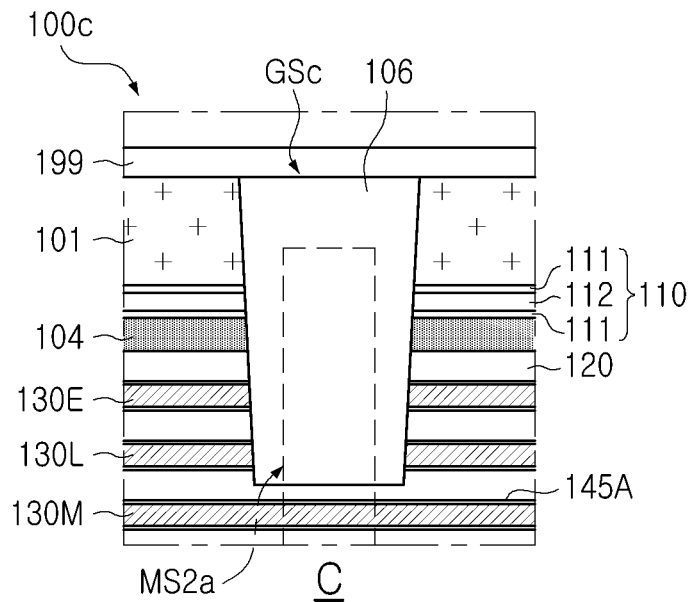

FIGS. 5A to 5C are partially enlarged views illustrating a semiconductor device according to example embodiments. FIGS. 5A to 5C illustrate regions corresponding to FIG. 3B.

Referring to FIG. 5A, in a semiconductor device 100*a*, the gate electrodes 130 further include a dummy gate electrode 130D, and the first insulating region GSa may extend downwardly of the lower gate electrode 130L to further penetrate through a dummy gate electrode 130D. When a plurality of dummy gate electrodes 130D are stacked, the first insulating region GSa may penetrate through at least one of the dummy gate electrodes 130D. For example, the first insulating region GSa may extend to the interlayer insulating layer 120 on the uppermost memory gate electrode 130M.

As described above, in example embodiments, when the dummy gate electrode 130D is disposed above and below the lower gate electrode 130L, the first insulating region GSa may further penetrate through the dummy gate electrode 130D.

Referring to FIG. 5B, in a semiconductor device 100b, the first insulating region GSb may be disposed to penetrate through only the lower gate electrodes 130L among the gate electrodes 130. In the present embodiment, the gate electrodes 130 may not include the erase gate electrode 130E (see FIG. 3B), and the lower gate electrode 130L may be disposed as an uppermost gate electrode among the gate electrodes 130.

In example embodiments, when the arrangement order of the lower gate electrode 130L in the gate electrodes 130 is changed, the first insulating region GSb may extend to a depth of penetrating through the lower gate electrode 130L.

Referring to FIG. 5C, in a semiconductor device 100c, the first insulating region GSc may be disposed to penetrate through a single erase gate electrode 130E and a lower gate electrode 130L. In the present embodiment, the gate electrodes 130 may include only one erase gate electrode 130E on the lower gate electrode 130L.

As described above, in example embodiments, the number of erase gate electrodes 130E disposed on the lower gate electrode 130L may vary and the first insulating region GSc may be disposed to penetrate through all of the erase gate electrodes 130E. Also, in example embodiments, when a plurality of lower gate electrodes 130L are disposed, the first insulating region GSc may be disposed to penetrate all of the lower gate electrodes 130L.

Figure 6:
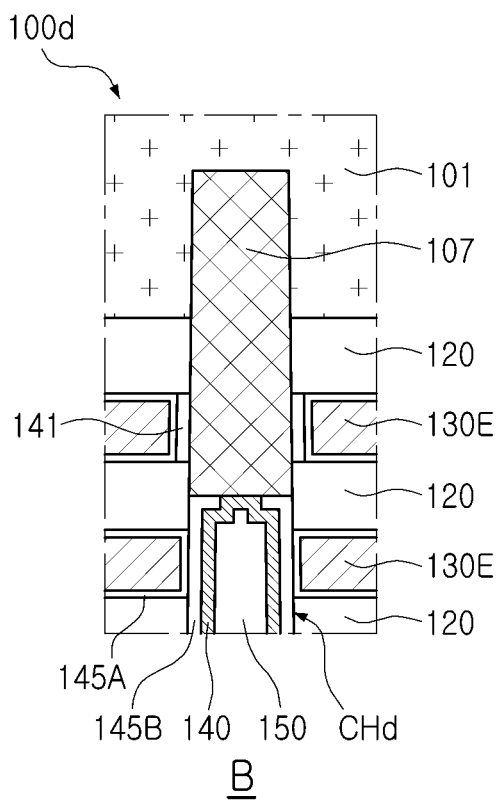
FIG. 6 is a partially enlarged view illustrating a semiconductor device according to example embodiments.

FIG. 6 is a partially enlarged view illustrating a semiconductor device according to example embodiments. FIG. 6 illustrates a region corresponding to FIG. 3A.

Referring to FIG. 6, in a semiconductor device 100d, the second substrate structure S2 may not include the first and second horizontal conductive layers 102 and 104 on the lower surface of the plate layer 101, unlike the embodiment of FIGS. 2A to 2D. In addition, the channel structure CHd may further include an epitaxial layer 107.

The epitaxial layer 107 may be disposed on the lower surface of the plate layer 101 on an upper end of the channel structure CHd, and may be disposed on a side surface of at least one gate electrode 130. The epitaxial layer 107 may be disposed in a recessed region of the plate layer 101. A lower surface of the epitaxial layer 107 may be positioned between vertically adjacent or aligned gate electrodes 130. For example, the lower surface of the epitaxial layer 107 may be disposed between the erase gate electrodes 130E, but example embodiments are not limited thereto. The epitaxial layer 107 may be connected to the channel layer 140 through the lower surface thereof. A gate insulating layer 141 may be further disposed between the epitaxial layer 107 and the erase gate electrode 130E in contact with the epitaxial layer 107.

Figure 7A:
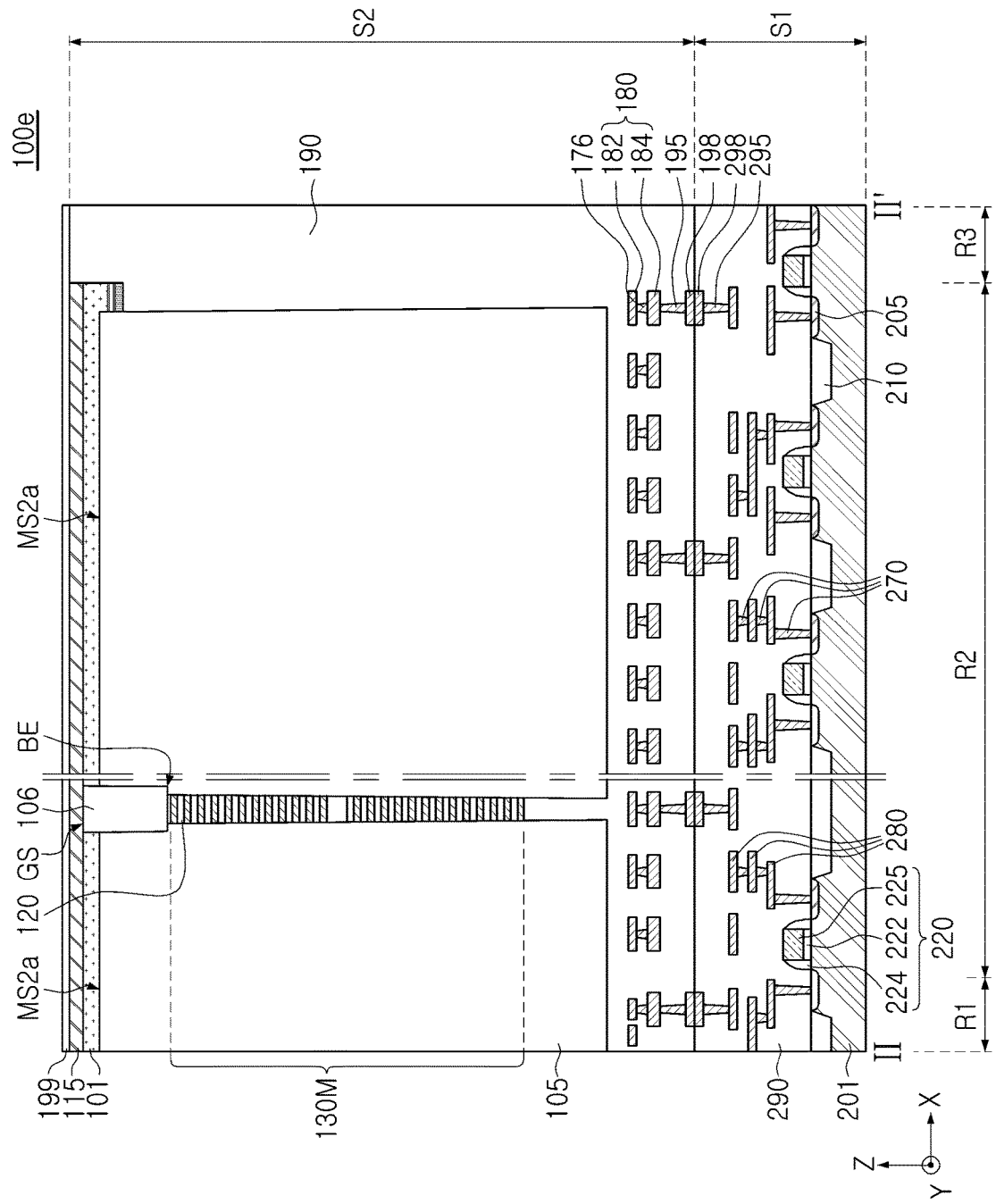
FIGS. 7A and 7B are schematic cross-sectional views of a semiconductor device according to example embodiments.
Figure 7B:
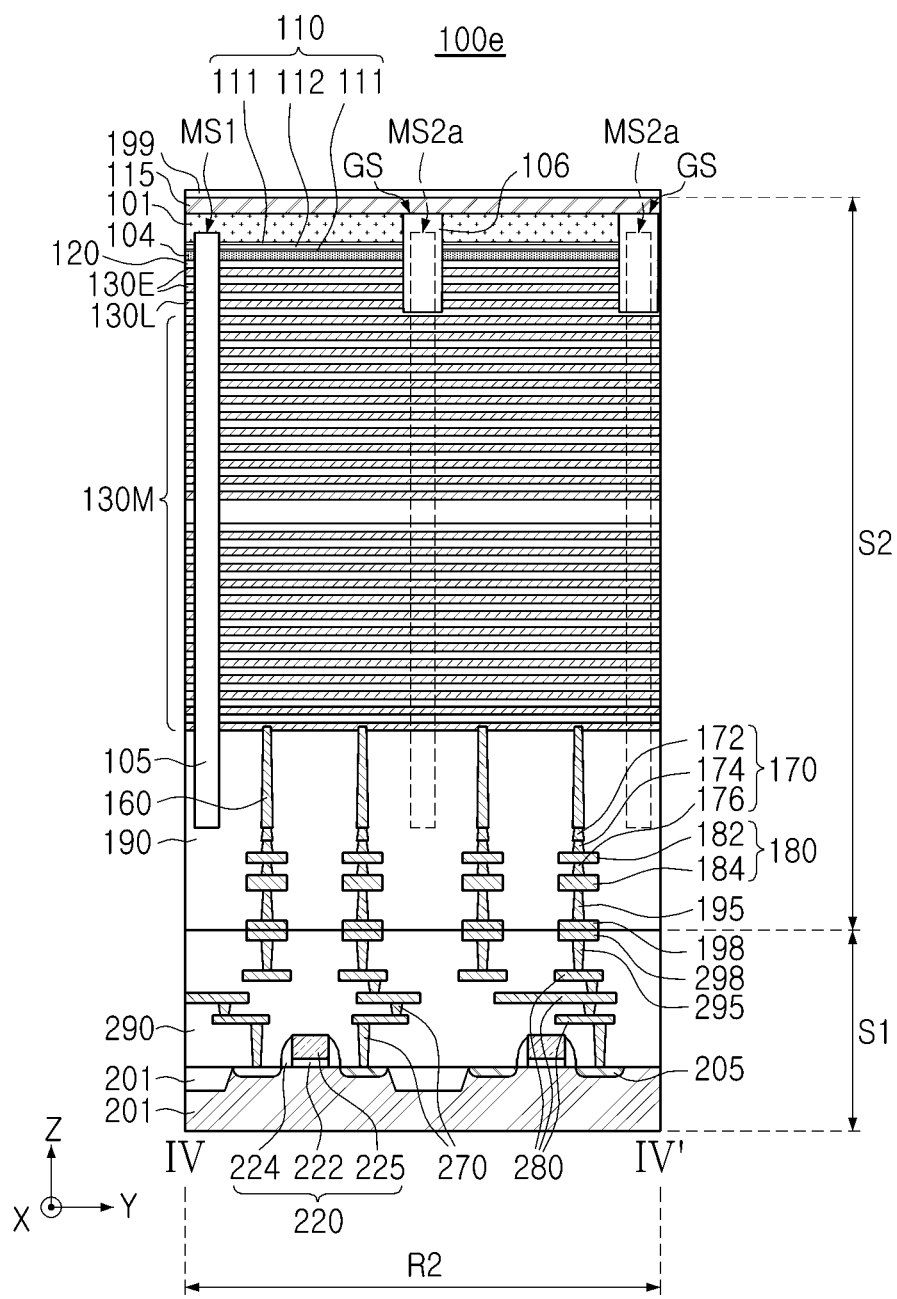

FIGS. 7A and 7B are schematic cross-sectional views of a semiconductor device according to example embodiments. FIG. 7A illustrates a cross-section corresponding to FIG. 2B, and FIG. 7B illustrates a cross-section corresponding to FIG. 2D.

Referring to FIGS. 7A and 7B, in a semiconductor device 100e, the second substrate structure S2 may further include a source conductive layer 115 disposed on the plate layer 101. The source conductive layer 115 may function as a common source line of the semiconductor device 100e together with the plate layer 101. The source conductive layer 115 may be disposed to cover an upper surface of the plate layer 101 and an upper surface of the first insulating regions GS. The source conductive layer 115 is illustrated as having the same size as the plate layer 101, but example embodiments are not limited thereto. A passivation layer 199 may be disposed on the source conductive layer 115. The source conductive layer 115 may include a metal material, for example, at least one of tungsten (W), copper (Cu), and aluminum (Al).

FIGS. 8 to 16 are schematic cross-sectional views illustrating a method of fabricating a semiconductor device according to example embodiments. FIGS. 8 to 10 and FIGS. 12 to 14 illustrate regions corresponding to FIG. 2A, and FIGS. 11, 15, and 16 illustrate regions corresponding to FIG. 2B.

Figure 8:
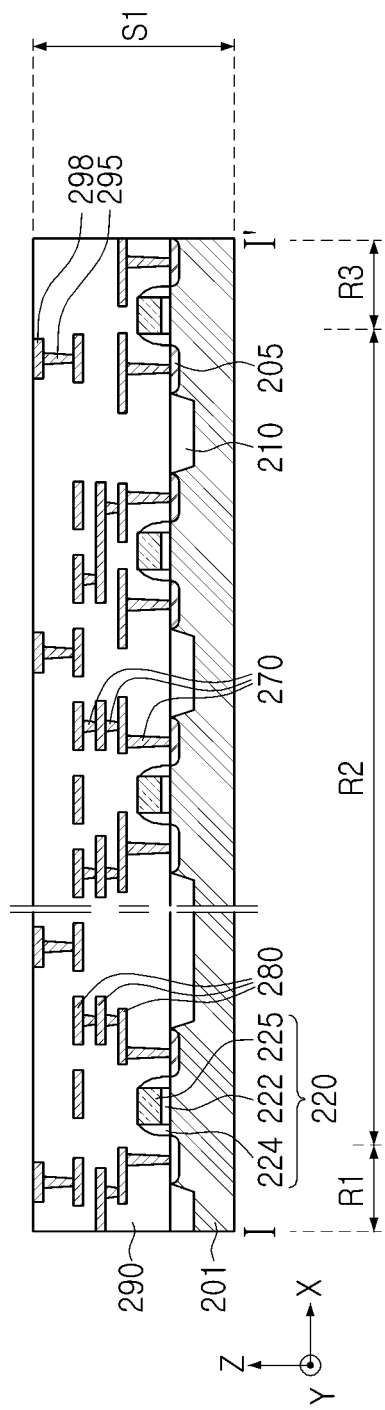
FIGS. 8 to 16 are schematic cross-sectional views illustrating a method of fabricating a semiconductor device according to example embodiments.

Referring to FIG. 8, a first substrate structure S1 including circuit elements 220, a first interconnection structure, and a first bonding structure may be formed on a substrate 201.

Device isolation layers 210 may be formed in the substrate 201, and a circuit gate dielectric layer 222 and a circuit gate electrode 225 may be sequentially formed on the substrate 201. The device isolation layers 210 may be formed by, for example, a shallow trench isolation (STI) process. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of at least one of polycrystalline silicon and a metal silicide, but example embodiments are not limited thereto. Then, a spacer layer 224 and source/drain regions 205 may be formed on opposite sidewalls of the circuit gate dielectric layer 222 and the circuit gate electrode 225. According to example embodiments, the spacer layer 224 may include a plurality of layers. Then, an ion implantation process may be performed to form the source/drain regions 205.

The circuit contact plugs 270 of the first interconnection structure and the first bonding vias 295 of the first bonding structure may be formed by forming a portion of a peripheral region insulating layer 290, etching the portion to be removed, and filling a removed portion with a conductive material. The circuit interconnection lines 280 of the first interconnection structure and the first bonding metal layers 298 of the first bonding structure may be formed by, for example, depositing a conductive material and patterning the deposited conductive material. The first bonding metal layers 298 may be formed to expose upper surfaces thereof through the peripheral region insulating layer 290.

The peripheral region insulating layer 290 may include a plurality of insulating layers. A portion of the peripheral region insulating layer 290 may be formed in each operation of forming the first interconnection structure and the first bonding structure. The first substrate structure S1 may be prepared by the present operation.

Figure 9:
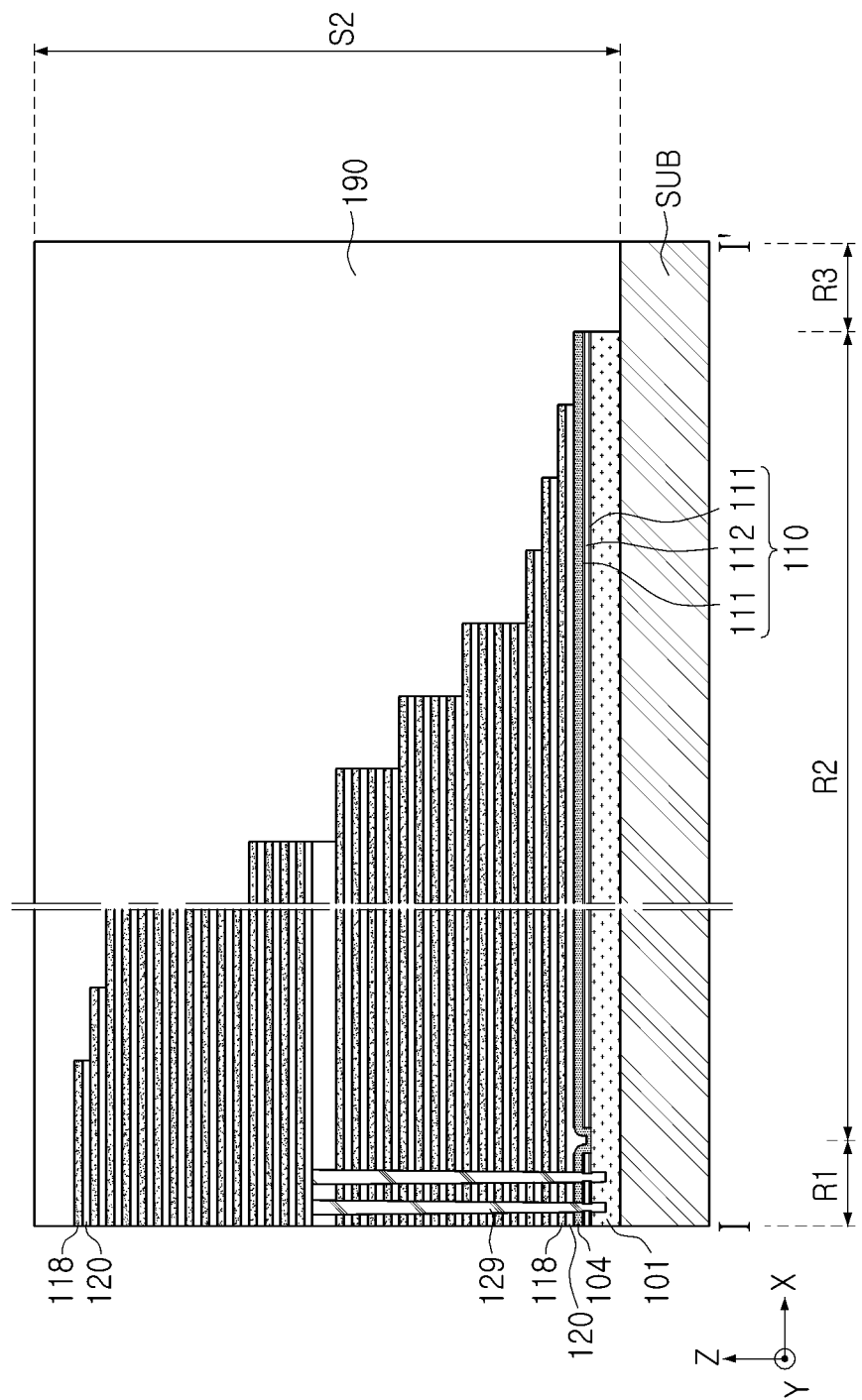

Referring to FIG. 9, a process of preparing the second substrate structure S2 may start. A plate layer 101 may be formed on a base substrate SUB, a horizontal insulating layer 110 and a second horizontal conductive layer 104 may be formed, and sacrificial insulating layers 118 and interlayer insulating layers 120 may be sequentially stacked, and channel sacrificial layers 129 may then be formed.

The base substrate SUB may be a layer that is removed through a subsequent process, and may be a semiconductor substrate such as a silicon (Si) substrate. The plate layer 101 may be formed of, for example, a polycrystalline silicon layer or an epitaxial layer. In the present operation, a cover layer or an etch-stop layer may be additionally formed before the formation of the plate layer 101.

The horizontal insulating layer 110 may be formed by alternately stacking the first and second horizontal insulating layers 111 and 112 on the plate layer 101. The horizontal insulating layer 110 may be replaced with the first horizontal conductive layer 102 of FIG. 2A in the first region R1 through a subsequent process. The first horizontal insulating layers 111 may include a material different from that of the second horizontal insulating layer 112. For example, the first horizontal insulating layers 111 may be formed of the same material as the interlayer insulating layers 120, and the second horizontal insulating layer 112 may be formed of the same material as the sacrificial insulating layers 118.

The second horizontal conductive layer 104 may be formed on the horizontal insulating layer 110 and may be in contact with the plate layer 101 in a region in which the horizontal insulating layer 110 is removed. Accordingly, the second horizontal conductive layer 104 may be bent along end portions of the horizontal insulating layer 110, may cover the end portions, and may extend onto the plate layer 101.

The plate layer 101, the horizontal insulating layer 110, and the second horizontal conductive layer 104 may be patterned to be removed in the third region R3, and the removed region may be filled with a portion of the cell region insulating layer 190.

The sacrificial insulating layers 118 may be formed alternately with the interlayer insulating layers 120 to constitute a lower stack structure and an upper stack structure. After the lower stack structure is formed, channel sacrificial layers 129 may be formed and the upper stack structure may be formed.

The sacrificial insulating layers 118 may be replaced with the gate electrodes 130 through a subsequent process. The sacrificial insulating layers 118 may be formed of a material having an etch selectivity with respect to the interlayer insulating layers 120. For example, the interlayer insulating layer 120 may be formed of at least one of silicon oxide and silicon nitride, and the sacrificial insulating layers 118 may be formed of a material, different from that of the interlayer insulating layer 120, selected from the group consisting of silicon, silicon oxide, silicon carbide, and silicon nitride. In example embodiments, thicknesses of the interlayer insulating layers 120 may not all be the same.

The channel sacrificial layers 129 may be formed by forming lower channel holes to penetrate through the lower stack structure in a region corresponding to the first channel structures CH1 (see FIG. 2A) and then depositing a material of the channel insulating layers 129 in the lower channel holes. The channel sacrificial layers 129 may include, for example, polycrystalline silicon.

A photolithography process and an etching process may be repeatedly performed on the sacrificial insulating layers 118 and the interlayer insulating layers 120 such that overlying sacrificial insulating layers 118 are shorter than underlying sacrificial insulating layers 118. Accordingly, the sacrificial insulating layers 118 may have a staircase or stepped shape. In example embodiments, the sacrificial insulating layers 118 may be formed to have a relatively small thickness on an end portion thereof. To this end, a process may be further performed. Then, an insulating material covering an upper portion of the stack structure of the sacrificial insulating layers 118 and the interlayer insulating layers 120 may be deposited to further form a portion of the cell region insulating layer 190.

Figure 10:
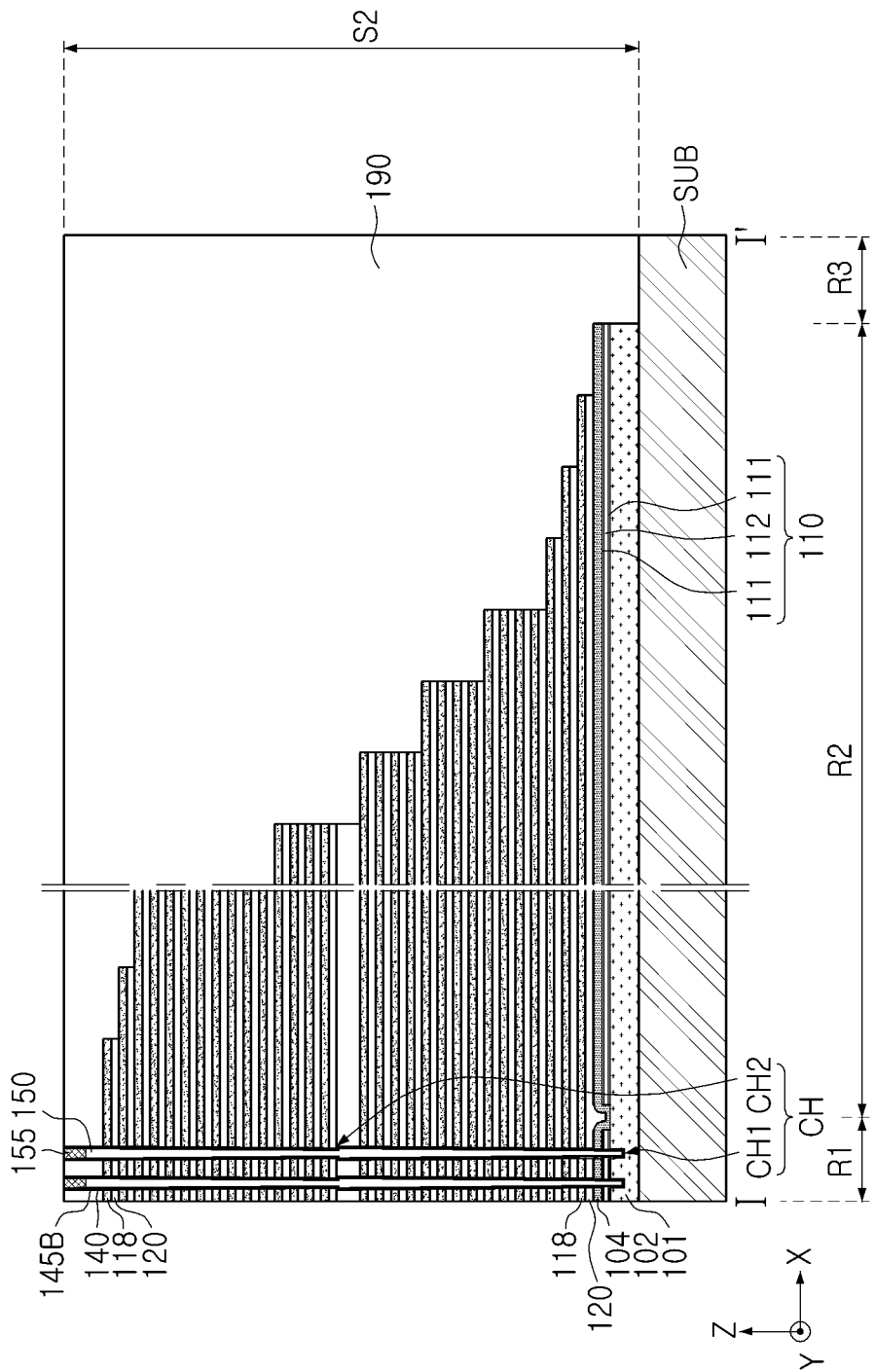

Referring to FIG. 10, channel structures CH may be formed to penetrate through the stack structure of the sacrificial insulating layers 118 and the interlayer insulating layers 120.

In the upper stack structure, a portion of the sacrificial insulating layers 118 and the interlayer insulating layers 120 may be removed to form a second insulating region SS (see FIG. 2C). To form the second insulating region SS, a region in which the second insulating region SS is to be formed may be exposed using an additional mask layer, a predetermined number of sacrificial insulating layers 118 and interlayer insulating layers 120 may be removed from an uppermost portion, and the insulating material may then be deposited to form a second insulating layer 103 (see FIG. 2C).

To form channel structures CH, the upper stack structure may be anisotropically etched on the channel sacrificial layers 129 to form upper channel holes and channel sacrificial layers 129 exposed through the upper channel holes may be removed. Accordingly, channel holes including the lower channel holes and the upper channel holes connected to each other may be formed.

A second gate dielectric layer 145B, a channel layer 140, a channel filling layer 150, and the channel pad 155 may be sequentially formed in each of the channel holes to form channel structures CH including first and second channel structures CH1 and CH2. The channel layer 140 may be formed on a second gate dielectric layer 145B in the channel structures CH. The channel filing insulating layer 150 may be formed to fill the channel structures CH and may be an insulating material. However, according to example embodiments, a space between the channel layers 140, rather than the channel filling layers 150, may be filled. The channel pads 155 may be formed of a conductive material, and may be formed of, for example, polycrystalline silicon.

Figure 11:
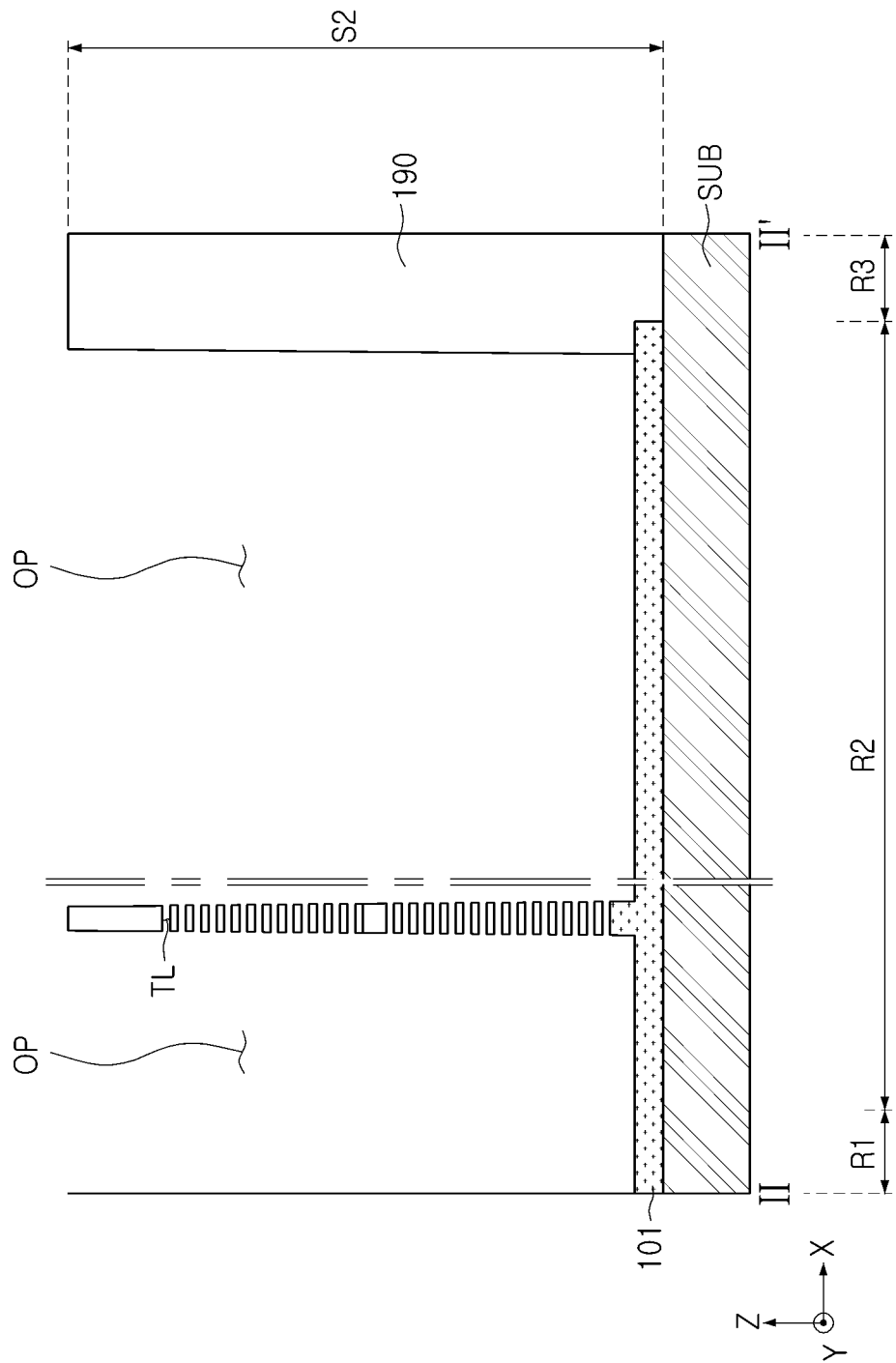

Referring to FIG. 11, openings OP may be formed to penetrate through the stack structure of the sacrificial insulating layers 118 and the interlayer insulating layers 120, a first horizontal conductive layer 102 may be formed, and the sacrificial insulating layers 118 may be removed through the openings OP to form tunnel portions TL.

The openings OP may be formed in regions corresponding to the first and second separation regions MS1, MS2A and MS2b (see FIG. 1A), and may be in the form of a trench extending in an X direction.

A portion of the horizontal insulating layer 110 may be removed. The second horizontal insulating layer 112 may be exposed by an etch-back process while forming additional sacrificial spacer layers in the openings OP. The exposed second horizontal insulating layer 112 may be selectively removed, and the upper and lower first horizontal insulating layers 111 may then be removed. The horizontal insulating layer 110 may be removed by, for example, a wet etching process. During a process of removing the first horizontal insulating layers 111, a portion of the exposed second gate dielectric layer 145B may also be removed in the region in which the second horizontal insulating layer 112 is removed. The horizontal insulating layer 110 may be deposited in the region, in which the horizontal insulating layer 110 is removed, to form a first horizontal conductive layer 102, and the sacrificial spacer layers may then be removed in the openings OP. The present process may allow the first horizontal conductive layer 102 to be formed in the first region R1 and may allow the horizontal insulating layer 110 to remain in the second region R2.

The sacrificial insulating layers 118 may be removed selectively with respect to the interlayer insulating layers 120 using, for example, wet etching. Accordingly, the tunnel portions TL may be formed between the interlayer insulating layers 120.

Figure 12:
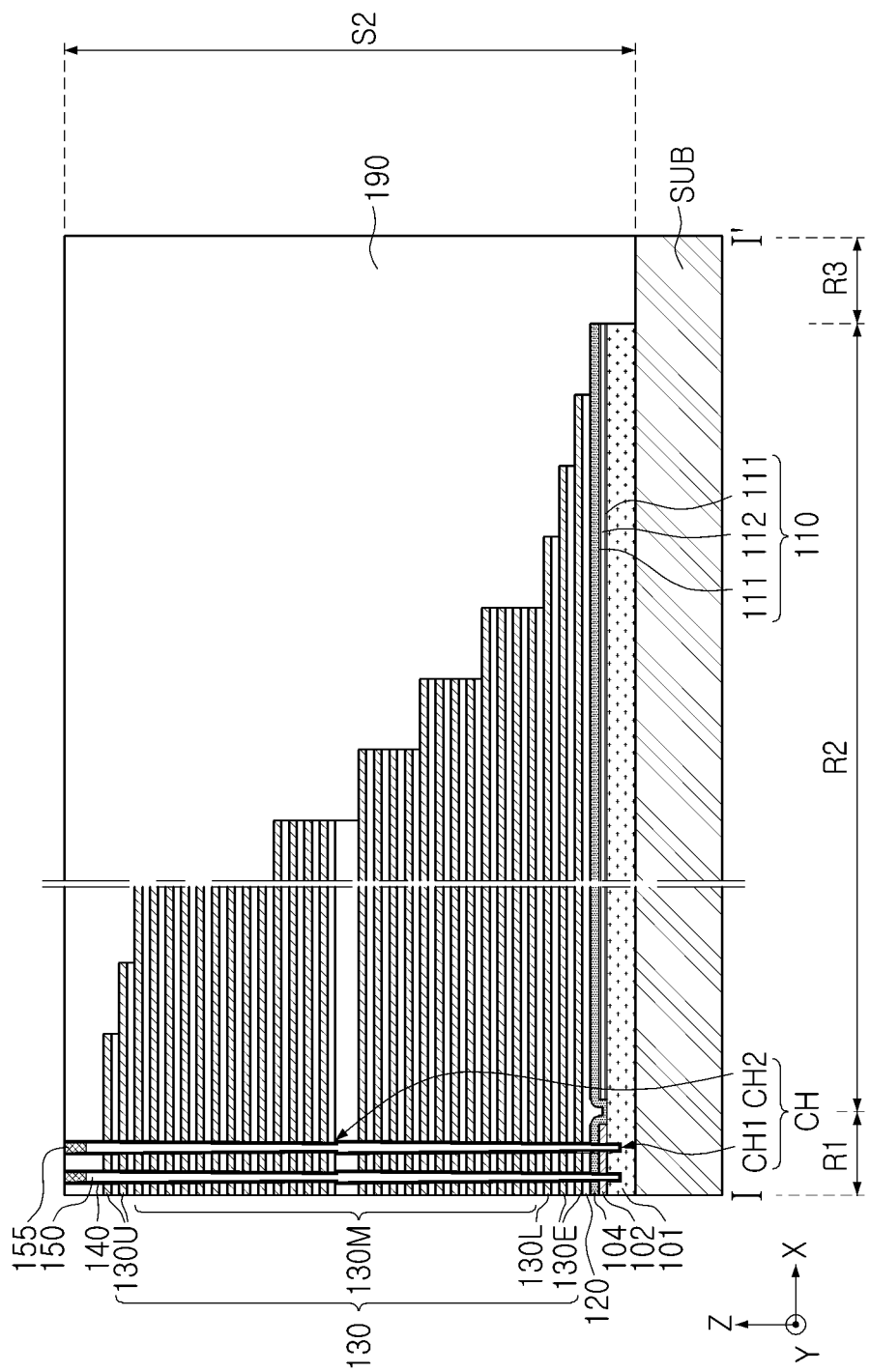

Referring to FIG. 12, gate electrodes 130 may be formed in the region in which the sacrificial insulating layers 118 are removed.

Before the formation of the gate electrodes 130, first gate dielectric layers 145A (see FIGS. 3A and 3B) may be formed. The first gate dielectric layers 145A may be formed to extend horizontally along the tunnel portions TL, and may be formed to cover the sidewalls of the channel structures CH through the tunnel portions TL.

The gate electrodes 130 may be formed by filling the tunnel portions TL with a conductive material. The gate electrodes 130 may include a metal, polycrystalline silicon, or a metal silicide material. Then, the openings OP may be filled with an insulating material to form a separation insulating layer 105.

Figure 13:
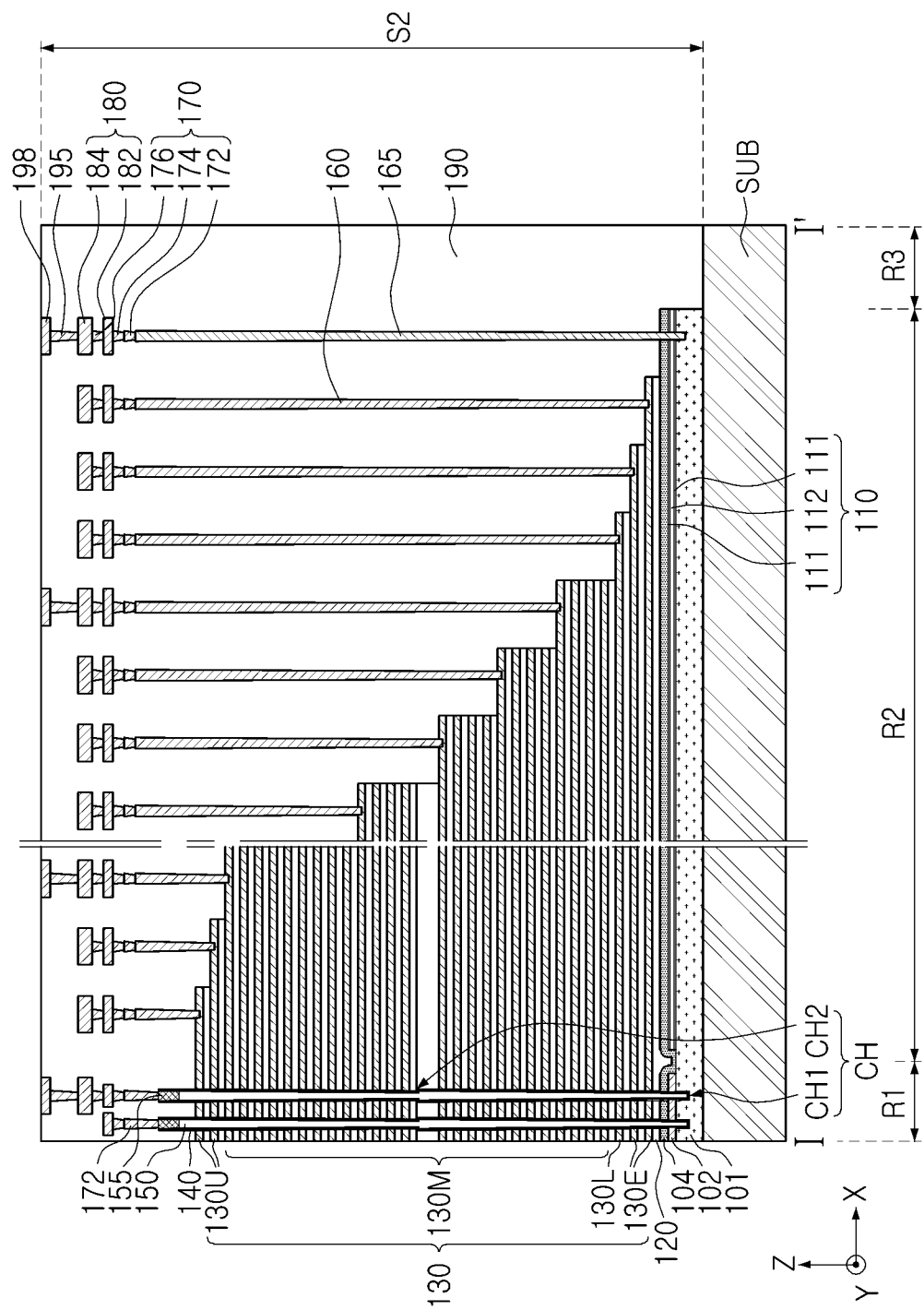

Referring to FIG. 13, a second interconnection structure and a second bonding structure may be formed on the gate electrodes 130.

In the second interconnection structure, the gate contacts 160 and the substrate contact 165 may be formed by etching the cell region insulating layer 190 on the gate electrodes 130 and the plate layer 101 to form contact holes and filling the contact holes with a conductive material. The cell contact plugs 170 may be formed by etching the cell region insulating layer 190 on the channel pads 155, the gate contacts 160, and the substrate contact 165 and depositing a conductive material. The cell interconnection lines 180 may be formed through deposition and patterning processes of a conductive material, or by forming a portion of an insulating layer constituting the cell region insulating layer 190, patterning the portion of the insulating layer, and depositing a conductive material.

The second bonding vias 195 and the second bonding metal layers 198, constituting the second bonding structure, may be formed by further forming the cell region insulating layer 190 on the cell interconnection lines 180 and removing a portion of the cell region insulating layer 190. An upper surface of the second bonding metal layers 198 may be exposed from the cell region insulating layer 190.

Figure 14:
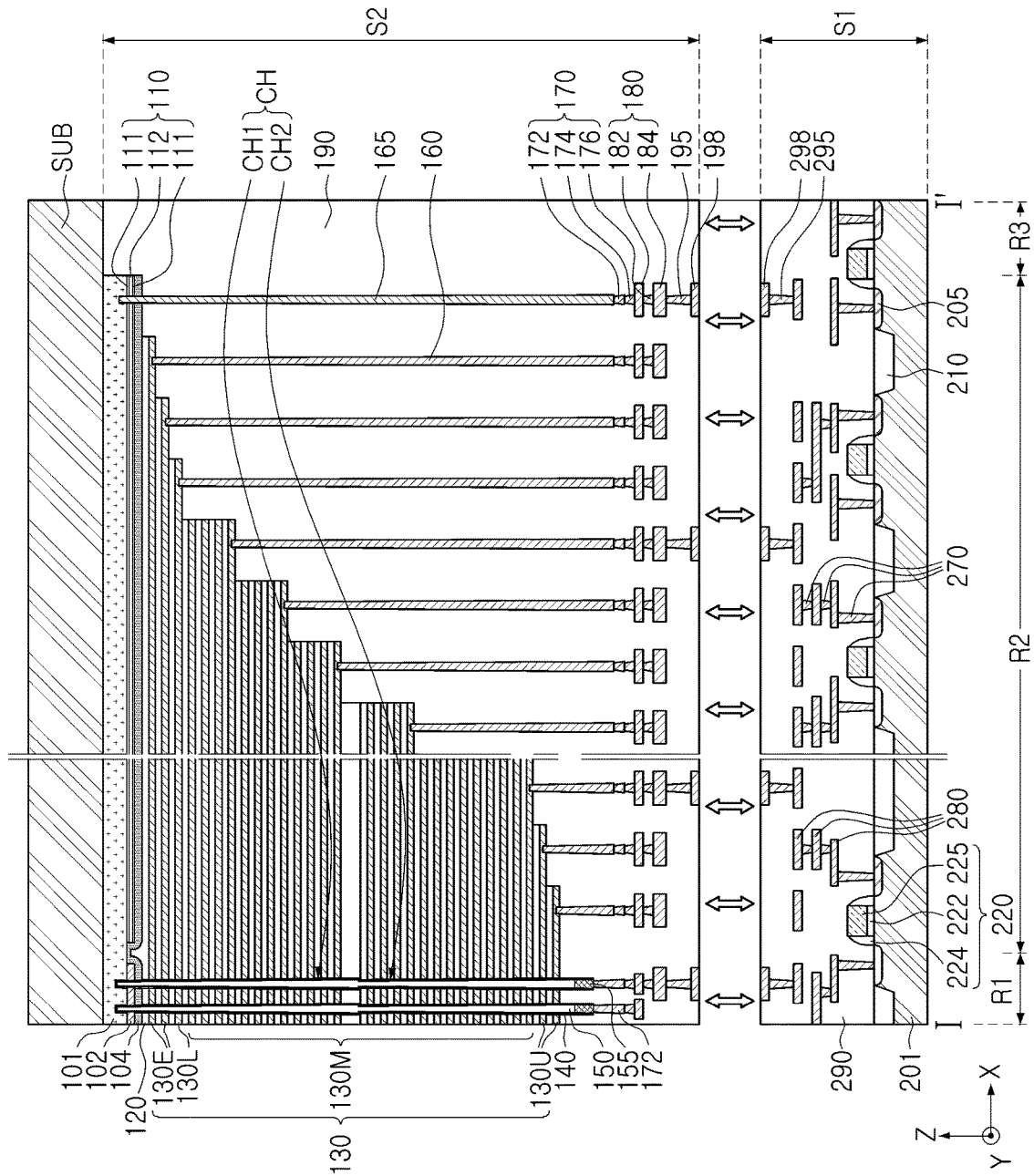

Referring to FIG. 14, the first substrate structure S1 and the second substrate structure S2 may be bonded to each other.

The first substrate structure S1 and the second substrate structure S2 may be connected by bonding the first bonding metal layers 298 and the second bonding metal layers 198 by applying pressure. At the same time, portions of the peripheral region insulating layer 290 and the cell region insulating layer 190 corresponding to the bonding insulating layers may be bonded by applying pressure. After inverting the second substrate structure S2 to face downwardly on the first substrate structure S1, bonding may be performed. For better understanding, in the drawing, the second substrate structure S2 is illustrated as being bonded in the form of a mirror image of the structure illustrated in FIG. 13.

The first substrate structure S1 and the second substrate structure S2 may be directly bonded to each other without an adhesive such as an additional adhesive layer interposed therebetween. According to example embodiments, before bonding, a surface treatment process such as a hydrogen plasma treatment may be further performed on an upper surface of the first substrate structure S1 and a lower surface of the second substrate structure S2 to strengthen bonding strength.

Figure 15:
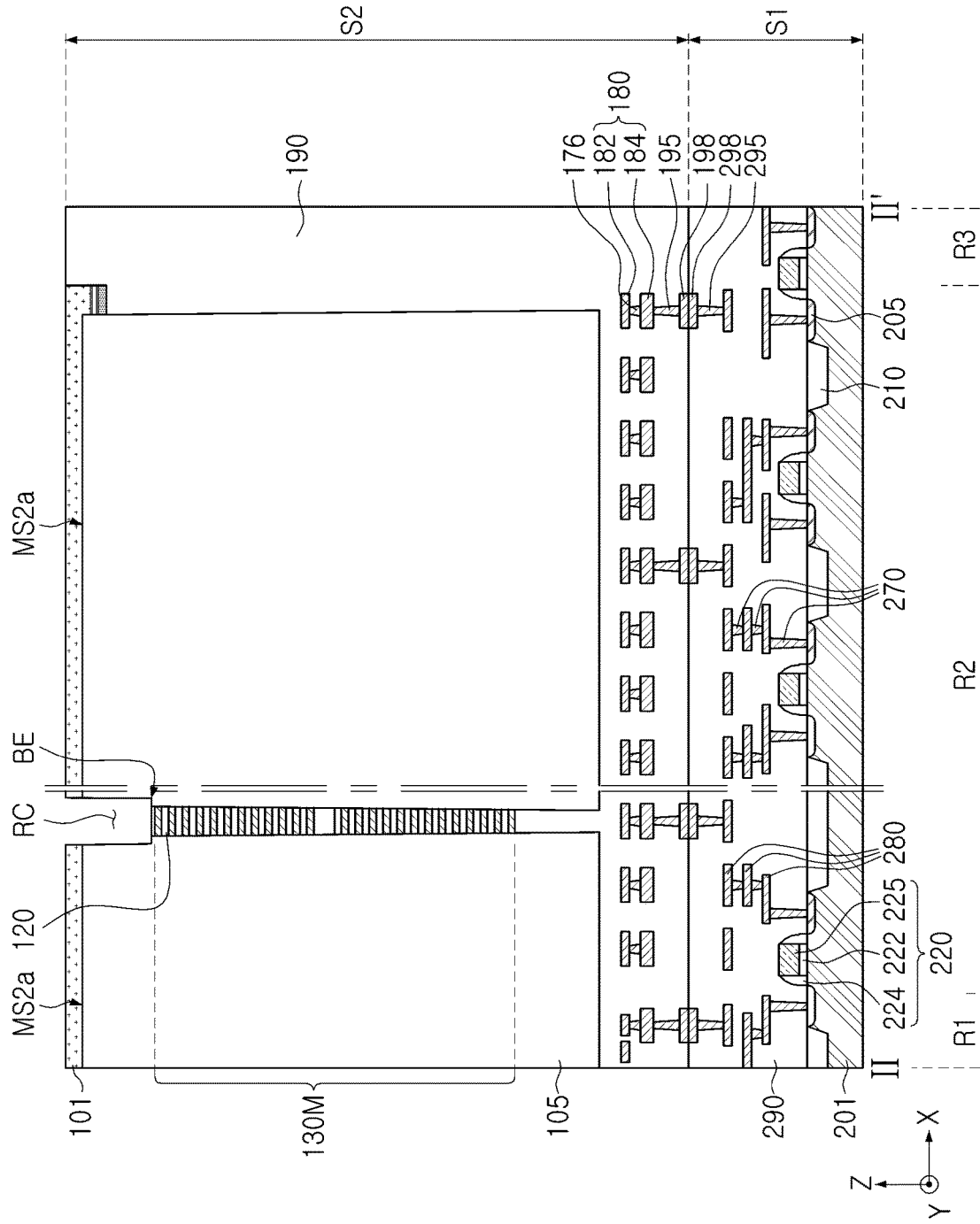

Referring to FIG. 15, the base substrate SUB of the second substrate structure S2 may be removed and a recess region RC may be formed on the bonding structure of the first and second substrate structures S1 and S2.

A portion of the base substrate SUB may be removed from an upper surface of the second substrate structure S2 by a polishing process such as a grinding process, and the other portion of the base substrate SUB may be removed by an etching process such as a wet etching process. The base substrate SUB of the second substrate structure S2 may be removed to significantly reduce a total thickness of the semiconductor device. According to example embodiments, a portion of the plate layer 101 may also be removed.

The recess region RC may be formed at a position corresponding to the first insulating region GS (see FIG. 2B). The recess region RC may be formed by removing the plate layer 101, the horizontal insulating layer 110, the second horizontal conductive layer 104, some of the gate electrodes 130, some of the interlayer insulating layers 120, and some of the first gate dielectric layers 145A (see FIG. 3B), from the upper surface of the plate layer 101. The recess region RC may be formed to have side surfaces inclined such that a width of a lower end thereof is decreased. The side surfaces of the recess region RC may have a slope opposing a slope of the channel structures CH, the first and second separation regions MS1, MS2a, and MS2b, the second interconnection structure, and the second bonding structures. This is because the recess region RC is formed to extend from an upper surface of the plate layer 101. The degree of inclination of the side surfaces of the recess region RC may vary depending on a depth of the recess region RC.

The recess region RC may be formed by removing a portion of the second intermediate separation regions MS2a together in a cross-section taken in an X direction. Accordingly, a bent portion BE may be formed in the second intermediate separation regions MS2a. Side surfaces of the gate electrodes 130, including the erase gate electrodes 130E and the lower gate electrode 130L, and side surfaces of the first gate dielectric layers 145A (see FIG. 3B) may be exposed through the recess region RC in a cross-section taken in a Y direction through the recess region RC.

Figure 16:
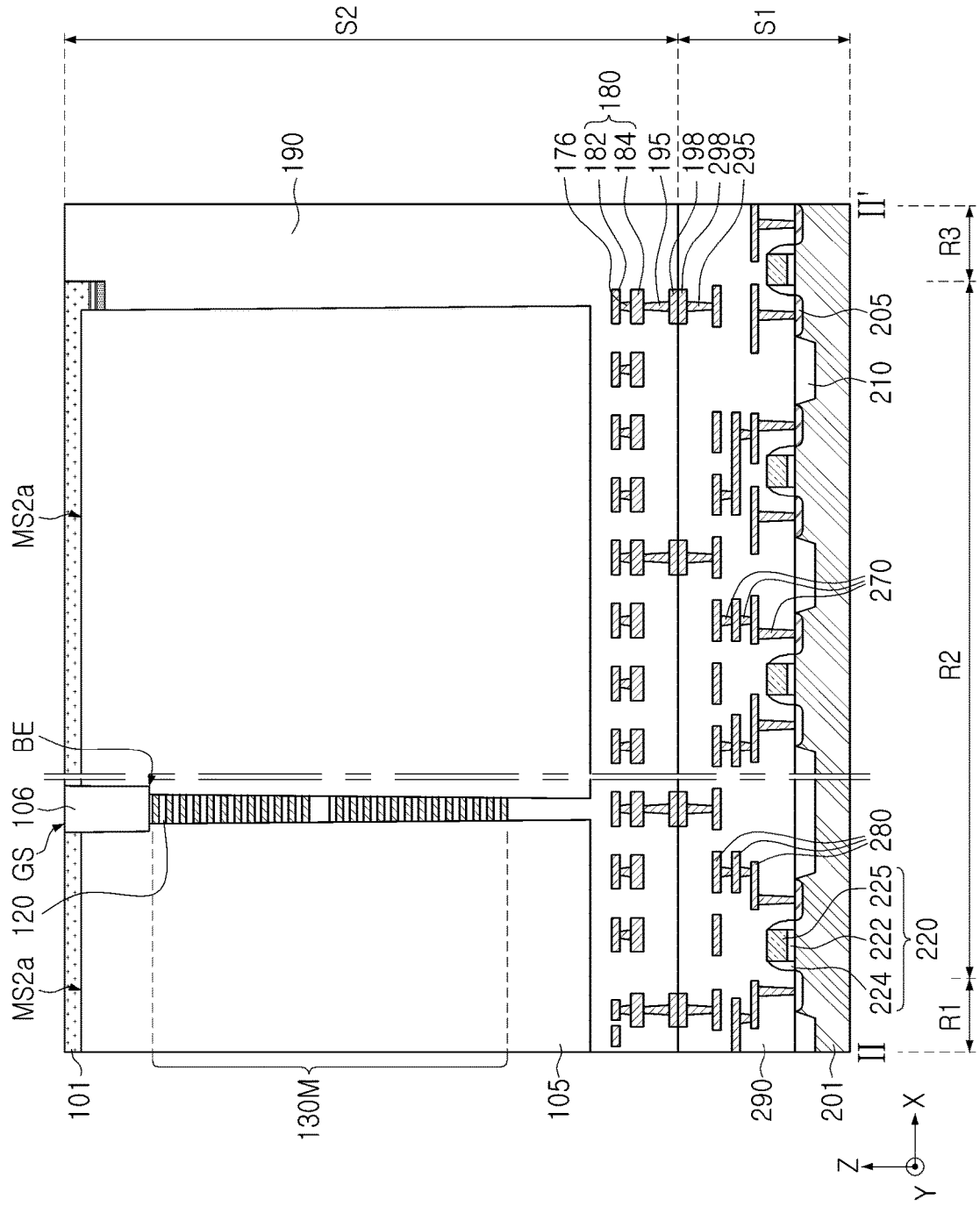

Referring to FIG. 16, a first insulating layer 106 may be formed in the recess region RC to form a first insulating region GS.

The first insulating region GS may be formed by depositing an insulating material and performing a planarization process. An upper surface of the first insulating region GS may be substantially coplanar with an upper surface of the plate layer 101, but example embodiments are not limited thereto.

Referring to FIGS. 2A and 2B together, a passivation layer 199 may be formed on the plate layer 101 to finally fabricate the semiconductor device 100 of FIGS. 2A and 2B.

Figure 17:
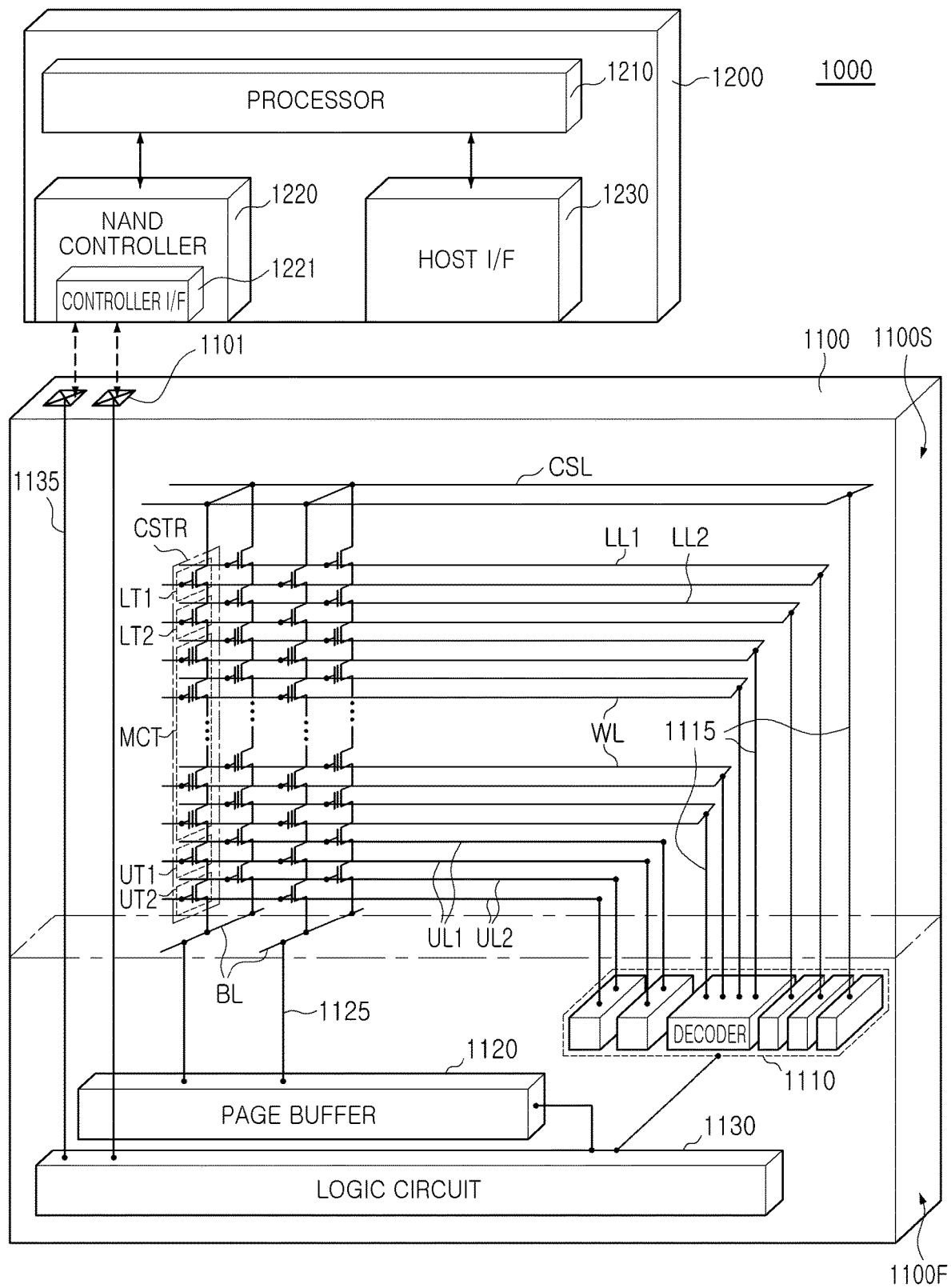
FIG. 17 is a schematic view illustrating a data storage system including a semiconductor device according to example embodiments.

FIG. 17 is a schematic view illustrating a data storage system including a semiconductor device according to example embodiments.

Referring to FIG. 17, a data storage system 1000 may include a semiconductor device 1100 and a controller 1200 electrically connected to the semiconductor device 1100. The data storage system 1000 may be a storage device, including one or more semiconductor devices 1100, or an electronic device including a storage device. For example, the data storage system 1000 may be a solid state drive device (SSD) device including one or more semiconductor devices 1100, a universal serial bus (USB), a computing system, a medical device, or a communications device.

The semiconductor device 1100 may be or include a nonvolatile memory device and may be, for example, the NAND flash memory device described with reference to FIGS. 1 to 7B. The semiconductor device 1100 may include a first structure 1100F and a second structure 1100S on the first structure 1100F. In example embodiments, the first semiconductor structure 1100F may be disposed alongside the second semiconductor structure 1100S. In example embodiments, the first structure 1100F may be a peripheral circuit structure including a decoder circuit 1110, a page buffer 1120, and a logic circuit 1130. The second structure 1100S may be a memory cell structure including a bitline BL, a common source line CSL, wordlines WL, first and second upper gate lines UL1 and UL2, first and second lower gate lines LL1 and LL2, and memory cell strings CSTR between the bitline BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may vary according to example embodiments.

In example embodiments, the upper transistors UT1 and UT2 may include string select transistor, and the lower transistors LT1 and LT2 may include a ground select transistor. The lower gate lines LL1 and LL2 may be gate electrodes of the lower transistors LT1 and LT2, respectively. The wordlines WL may be gate electrodes of the memory cell transistors MCT, and the upper gate lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT2 may be used in an erase operation in which data, stored in memory cell transistors MCT, is erased using a gate-induced drain leakage (GIDL) current.

The common source line CSL, the first and second lower gate lines LL1 and LL2, the wordlines WL, and the first and second upper gate lines UL1 and UL2 may be electrically connected to the decoder circuit 1110 through first interconnections 1115, extending to the second structure 1100S, within the first structure 1100F. The bitlines BL may be connected to the page buffer 1120 through second interconnections 1125, extending to the second structure 1100S, within the first structure 1100F.

In the first structure 1100F, the decoder circuit 1110 and the page buffer 1120 may perform a control operation on at least one memory cell transistor MCT, among a plurality of memory cell transistors MCT. The decoder circuit 1110 and the page buffer 1120 may be controlled by the logic circuit 1130. The semiconductor device 1100 may communicate with the controller 1200 through an input/output (I/O) pad 1101 electrically connected to the logic circuit 1130. The I/O pad 1101 may be electrically connected to the logic circuit 1130 through an input/output (I/O) interconnection 1135, extending to the second structure 1100S, within the first structure 1100F.

The controller 1200 may include a processor 1210, a NAND controller 1220, and a host interface 1230. According to example embodiments, the data storage system 1000 may include a plurality of semiconductor devices 1100. In this case, the controller 1200 may control the plurality of semiconductor devices 1100.

The processor 1210 may control overall operation of the data storage system 1000 including the controller 1200. The processor 1210 may operate based on predetermined firmware, and may control the NAND controller 1220 to access the semiconductor device 1100. The NAND controller 1220 may include a NAND interface 1221 for processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, and the like, may be transmitted through the NAND interface 1221. The host interface 1230 may provide a communications function between the data storage system 1000 and an external host. When a control command is received from the external host through the host interface 1230, the processor 1210 may control the semiconductor device 1100 in response to the control command.

Figure 18:
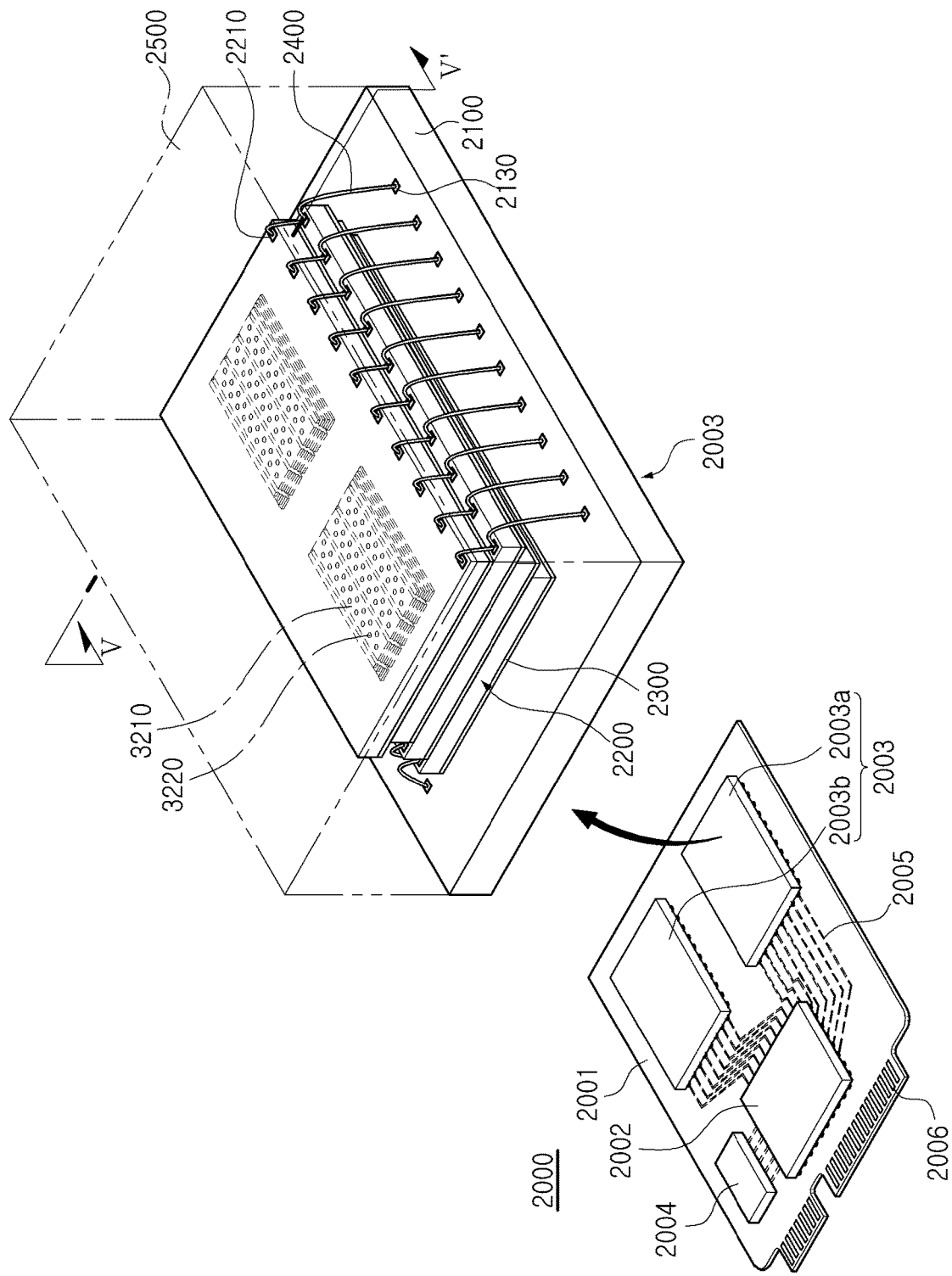
FIG. 18 is a schematic perspective view illustrating a data storage system including a semiconductor device according to example embodiments.

FIG. 18 is a schematic perspective view illustrating a data storage system including a semiconductor device according to example embodiments.

Referring to FIG. 18, a data storage system 2000 according to example embodiments may include a main substrate 2001, a controller 2002 mounted on the main substrate 2001, one or more semiconductor packages 2003, and a DRAM 2004. The semiconductor package 2003 and the DRAM 2004 may be connected to the controller 2002 through interconnection patterns 2005 formed on the main substrate 2001.

The main substrate 2001 may include a connector 2006 including a plurality of pins coupled to the external host. In the connector 2006, the number and disposition of the plurality of pins may vary depending on a communications interface between the data storage system 2000 and the external host. In example embodiments, the data storage system 2000 may communicate with the external host based on an interface, among interfaces such as universal serial bus (USB), peripheral component interconnect express (PCI-Express), serial advanced technology attachment (SATA), M-PHY for universal flash storage (UFS), and the like. In example embodiments, the data storage system 2000 may operate with power supplied from the external host through a connector 2006. The data storage system 2000 may further include a power management integrated circuit (PMIC) dividing the power, supplied from the external host, to the controller 2002 and the semiconductor package 2003.

The controller 2002 may write data to the semiconductor package 2003 or read data from the semiconductor package 2003, and may increase operating speed of the data storage system 2000.

The DRAM 2004 may be a buffer memory for reducing a difference in speeds between the semiconductor package 2003, used as a data storage space, and the external host. The DRAM 2004, included in the data storage system 2000, may operate as a type of cache memory and may provide a space for temporarily storing data during a control operation for the semiconductor package 2003. When the DRAM 2004 is included in the data storage system 2000, the controller 2002 may further include a DRAM controller for controlling the DRAM 2004, in addition to a NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 respectively disposed on lower surfaces of the semiconductor chips 2200, a connection structure 2400 electrically connecting the semiconductor chips 2200 and the package substrate 2100 to each other, and a molding layer 2500 covering the semiconductor chips 2200 and the connection structure 2400 on the package substrate 2100.

The package substrate 2100 may be a printed circuit board (PCB) including upper package pads 2130. Each of the semiconductor chips 2200 may include an input/output (I/O) pad 2210. The I/O pad 2210 may correspond to the I/O pad 1101 of FIG. 17. Each of the semiconductor chips 2200 may include gate stack structures 3210 and channel structures 3220. Each of the semiconductor chips 2200 may include the semiconductor device described with reference to FIGS. 1 to 7B.

In example embodiments, the connection structure 2400 may be a bonding wire electrically connecting the I/O pad 2210 and the upper package pads 2130 to each other. Accordingly, in each of the first and second semiconductor packages 2003a and 2003b, the semiconductor chips 2200 may be electrically connected to each other by wire bonding, and may be electrically connected to the upper package pads 2130 of the package substrate 2100. According to example embodiments, in each of the first and second semiconductor packages 2003a and 2003b, the semiconductor chips 2200 may be electrically connected to each other by a connection structure including a through-silicon via (TSV), rather than the connection structure 2400 using wire bonding.

In example embodiments, the controller 2002 and the semiconductor chips 2200 may be included in a single package. In example embodiments, the controller 2002 and the semiconductor chips 2200 may be mounted on an additional interposer substrate, different from the main substrate 2001, and the controller 2002 and the semiconductor chips 2200 may be connected to each other by an interconnection formed on the interposer substrate.

Figure 19:
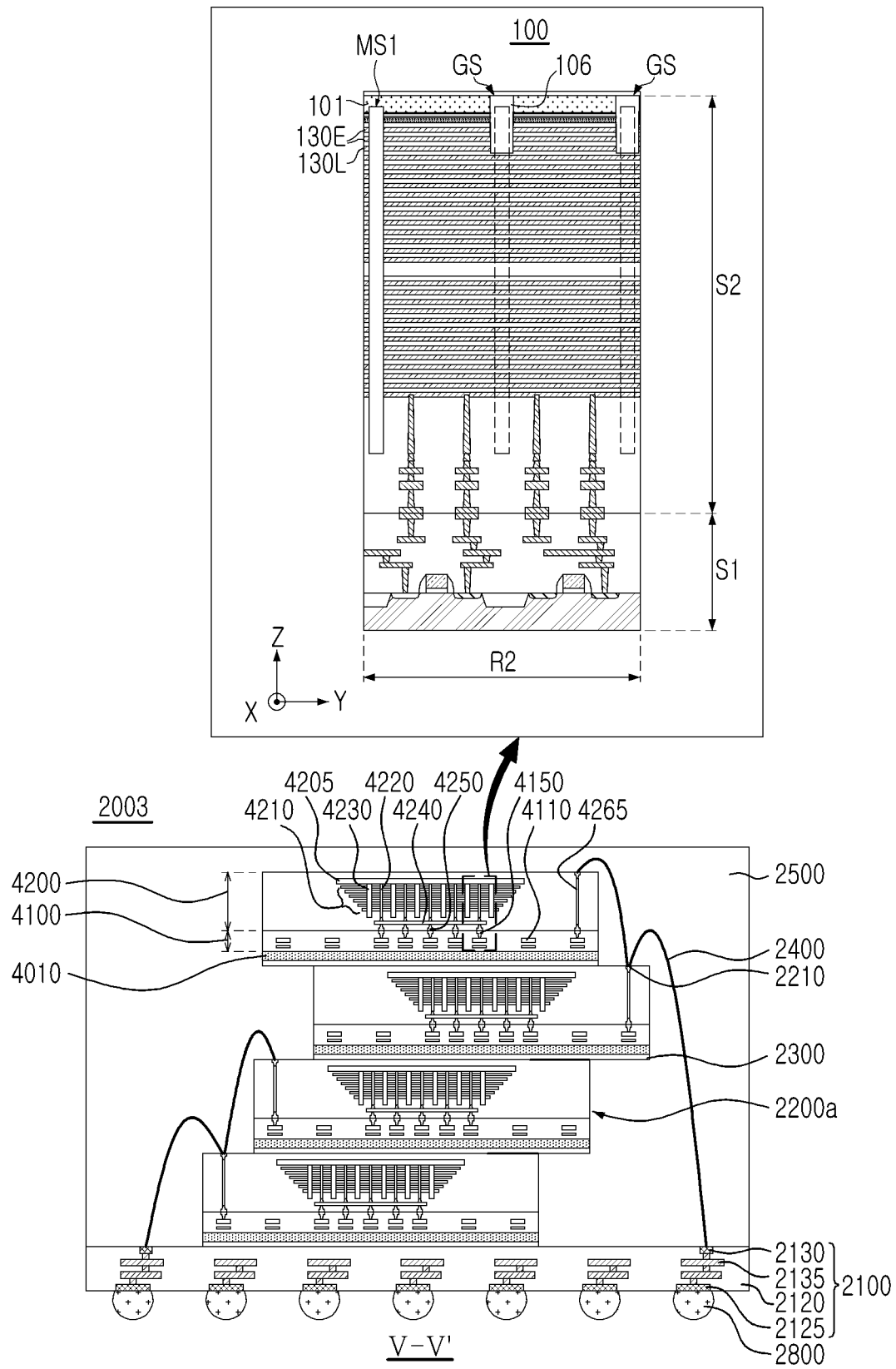
FIG. 19 is a schematic cross-sectional view illustrating a semiconductor package according to an example embodiment.

FIG. 19 is a schematic cross-sectional view illustrating a semiconductor package according to an example embodiment. FIG. 19 illustrates an example embodiment of the semiconductor package 2003 of FIG. 18, and conceptually illustrates a region taken along line V-V of the semiconductor package 2003 of FIG. 18.

Referring to FIG. 19, in the semiconductor package 2003, each of the semiconductor chips 2200a may include a semiconductor substrate 4010, a first structure 4100 on the semiconductor substrate 4010, and a second structure 4200 bonded to the first structure 4100 by a wafer bonding method on the first structure 4100.

The first structure 4100 may include a peripheral circuit region including a peripheral interconnection 4110 and first bonding structures 4150. The second structure 4200 may include a common source line 4205, a gate stack structure 4210 between the common source line 4205 and the first structure 4100, and channel structures 4220 and a separation region 4230 penetrating through the gate stack structure 4210, and second bonding structures 4250, respectively electrically connected to wordlines (WL of FIG. 17) of the memory channel structures 4220 and the gate stack structure 4210. For example, the second bonding structures 4250 may be electrically connected to the channel structures 4220 and wordlines (WL of FIG. 17) through bitlines 4240 electrically connected to the memory channel structures 4220 and gate contacts 160 (see FIG. 2A) electrically connected to the wordlines (WL of FIG. 17), respectively. The first bonding structures 4150 of the first structure 4100 and the second bonding structures 4250 of the second structure 4200 may be bonded to each other while being in contact with each other. Bonded portions of the first bonding structures 4150 and the second bonding structures 4250 may be formed of, for example, copper (Cu).

As illustrated in the enlarged view, the second structure 4200 may include a first insulating region GS extending from an upper surface of the plate layer 101 to penetrate through a lower gate electrode 130L constituting a ground select transistor. Each of the semiconductor chips 2200a may further include an input/output (I/O) pad 2210 and an input/output (I/O) interconnection 4265 below the I/O pad 2210. The I/O interconnection 4265 may be electrically connected to some of the second bonding structures 4250.

The semiconductor chips 2200a may be electrically connected to each other by connection structures 2400 in the form of bonding wires. However, in example embodiments, semiconductor chips in a single semiconductor package, such as the semiconductor chips 2200a, may be electrically connected to each other by a connection structure including a through-electrode TSV.

As described above, in a structure in which two or more substrate structures are bonded to each other, an insulating region is formed to extend from a rear surface of an upper substrate structure and to penetrate through at least one gate electrode. Accordingly, a semiconductor device having improved reliability and a data storage system including the same may be provided.

While example embodiments have been shown and described above, it will be apparent to those skilled in the art that modifications and variations could be made without departing from the scope of the present inventive concept as defined by the appended claims.

What is claimed is:
1. A semiconductor device comprising:
a first substrate structure including a substrate, circuit elements on the substrate, a first interconnection structure on the circuit elements, and first bonding metal layers on the first interconnection structure; and
a second substrate structure on the first substrate structure and connected to the first substrate structure,
wherein the second substrate structure comprises:
a plate layer;
gate electrodes spaced apart from each other and stacked in a first direction, perpendicular to a lower surface of the plate layer, below the plate layer and including first gate electrodes, second gate electrodes, and third gate electrodes sequentially disposed from the plate layer;
first gate dielectric layers extending along upper surfaces and lower surfaces of the gate electrodes;
channel structures penetrating through the gate electrodes and extending in the first direction, each of the channel structures including a channel layer;
first separation regions penetrating through the gate electrodes and extending in the first direction and a second direction, perpendicular to the first direction, and spaced apart from each other in a third direction, perpendicular to the first direction and the second direction;

second separation regions penetrating through the gate electrodes between the first separation regions, extending in the first direction and the second direction, and spaced apart from each other in the second direction in at least one region;

an insulating region extending from an upper surface of the plate layer and penetrating through the plate layer and the first gate electrodes between the second separation regions at the at least one region at which the second separation regions are spaced apart from each other in the second direction;

a second interconnection structure below the channel structures and the gate electrodes; and second bonding metal layers below the second interconnection structure and connected to the first bonding metal layers, and wherein the insulating region is in contact with side surfaces of the first gate electrodes and side surfaces of the first gate dielectric layers in contact with the first gate electrodes.

2. The semiconductor device of claim 1, wherein the insulating region has a first width at an upper portion of the insulating region and a second width, smaller than the first width, at a lower portion of the insulating region.

3. The semiconductor device of claim 2, wherein the first width is within a range of about 80 nm to about 150 nm.

4. The semiconductor device of claim 1, wherein side surfaces of the gate electrodes facing the channel structures are covered by the first gate dielectric layers and side surfaces of the gate electrodes facing the first and second separation regions and the insulating region are not covered by the first gate dielectric layers.

5. The semiconductor device of claim 1, wherein the second separation regions comprise bent portions along a lower end of the insulating region in a region in contact with the insulating region.

6. The semiconductor device of claim 1, wherein among the second gate electrodes, a second gate electrode adjacent the first gate electrodes is below the insulating region and comprises planar upper surfaces and lower surfaces.

7. The semiconductor device of claim 1, wherein at least one of the first gate electrodes constitutes a ground select transistor.

8. The semiconductor device of claim 7, wherein among the first gate electrodes, at least one first gate electrode disposed in an uppermost portion thereof constitutes an erase control transistor.

9. The semiconductor device of claim 8, wherein among the first gate electrodes, at least one first gate electrode disposed in a lowermost portion thereof is a dummy gate electrode.

10. The semiconductor device of claim 1, wherein the second substrate structure further includes a source conductive layer covering the upper surface of the plate layer and an upper surface of the insulating region.

11. The semiconductor device of claim 1, wherein the insulating region and the channel structures have side surfaces inclined in opposing directions.

12. The semiconductor device of claim 1, wherein the plate layer has a first region, in which the channel structures are disposed, and a second region in which the gate electrodes extend by different lengths in the second direction, and wherein the insulating region is disposed in the second region.

13. The semiconductor device of claim 1, wherein each of the channel structures further includes a second gate dielectric layer disposed outside of the channel layer and extending in the first direction to be in contact with each of the first gate dielectric layers.

14. A semiconductor device comprising:

a first substrate structure including a substrate, circuit elements disposed on the substrate, and first bonding metal layers disposed on the circuit elements; and a second substrate structure disposed on the first substrate structure and connected to the first substrate structure, wherein the second substrate structure comprises:

a plate layer;

gate electrodes spaced apart from each other and stacked in a first direction, perpendicular to a lower surface of the plate layer, below the plate layer;

separation regions penetrating through the gate electrodes and extending in a second direction, perpendicular to the first direction, and spaced apart from each other in the second direction in at least one region;

an insulating region extending from an upper surface of the plate layer and penetrating through the plate layer and at least one of the gate electrodes between the separation regions at the at least one region at which the separation regions are spaced apart from each other in the second direction; and second bonding metal layers disposed below the gate electrodes and connected to the first bonding metal layers, and wherein the insulating region has inclined side surfaces such that a width of the insulating region decreases in a direction toward the first substrate structure.

15. The semiconductor device of claim 14, wherein the insulating region has a first width at an upper portion of the insulating region and a second width, smaller than the first width, at a lower portion of the insulating region.

16. The semiconductor device of claim 14, wherein the insulating region is in direct contact with the at least one of the gate electrodes at side surfaces of the insulating region.

17. The semiconductor device of claim 14, wherein the separation regions are spaced apart from each other in the second direction by a first length, and the insulating region has a second length, greater than the first length, in the second direction.

18. The semiconductor device of claim 14, wherein a portion of a lower surface of the insulating region is in contact with the separation regions.

19. A data storage system comprising:

a semiconductor storage device including a first substrate structure including circuit elements and first bonding metal layers, a second substrate structure including channel structures and second bonding metal layers connected to the first bonding metal layers, and an input/output pad electrically connected to the circuit elements; and a controller electrically connected to the semiconductor storage device through the input/output pad and configured to control the semiconductor storage device, wherein the second substrate structure further comprises:

a plate layer;

gate electrodes spaced apart from each other and stacked in a first direction, perpendicular to a lower surface of the plate layer, below the plate layer;

separation regions penetrating through the gate electrodes and extending in a second direction, perpendicular to the first direction, and spaced apart from each other in the second direction in at least one region; and an insulating region extending from an upper surface of the plate layer and penetrating through the plate layer and at least one of the gate electrodes between the separation regions at the at least one region at which the separation regions are spaced apart from each other in the second direction, and wherein the insulating region has side surfaces that are inclined relative to the first direction such that a width of the insulating region decreases in a direction toward the first substrate structure.

20. The data storage system of claim 19, wherein the insulating region is in direct contact with the at least one of the gate electrodes through side surfaces of the insulating region.

* * * * *